(12) United States Patent
Tomatsu

(10) Patent No.: US 8,941,958 B2
(45) Date of Patent: Jan. 27, 2015

(54) SEMICONDUCTOR DEVICE

(75) Inventor: Hiroyuki Tomatsu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 24 days.

(21) Appl. No.: 13/448,496

(22) Filed: Apr. 17, 2012

(65) Prior Publication Data

US 2012/0268849 A1 Oct. 25, 2012

(30) Foreign Application Priority Data

Apr. 22, 2011 (JP) .................. 2011-096607
May 19, 2011 (JP) .................. 2011-112691

(51) Int. Cl.
*H02H 3/22* (2006.01)
*H01L 27/02* (2006.01)
*H01L 27/06* (2006.01)

(52) U.S. Cl.
CPC ......... *H01L 27/0266* (2013.01); *H01L 27/0688* (2013.01)
USPC .......................... 361/56; 361/91.1

(58) Field of Classification Search
CPC .......... H02H 9/041; H02H 3/202; H02H 3/22
USPC .................. 361/56, 91.1
See application file for complete search history.

(56) References Cited

U.S. PATENT DOCUMENTS

| | | | |
|---|---|---|---|
| 4,868,705 A * | 9/1989 | Shiochi et al. ......... | 361/56 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,320,241 B1 | 11/2001 | Okamoto | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

EP 1 737 044 A1 12/2006
EP 2 226 847 A2 9/2010

(Continued)

OTHER PUBLICATIONS

Sanghung Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

(Continued)

*Primary Examiner* — Jared Fureman
*Assistant Examiner* — Zeev V Kitov
(74) *Attorney, Agent, or Firm* — Fish & Richardson PC.

(57) ABSTRACT

To provide a protection circuit having a small area, redundancy, and small leak current. In the protection circuit, a plurality of nonlinear elements is provided so as to overlap with each other and so as to be electrically connected in series. At least one nonlinear element in the protection circuit is a diode-connected transistor including an oxide semiconductor in its channel formation region. The other nonlinear element is a diode-connected transistor including silicon in its channel formation region or a diode including silicon in its junction region.

5 Claims, 28 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,710,270 B2 * | 5/2010 | Shionoiri et al. ............ 340/572.1 |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0013353 A1 * | 1/2011 | Kwon et al. ............ 361/679.31 |
| 2011/0101351 A1 * | 5/2011 | Yamazaki ........................ 257/57 |
| 2011/0175087 A1 | 7/2011 | Yamazaki et al. |
| 2012/0032942 A1 | 2/2012 | Toyotaka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-092448 A | 4/1995 |
| JP | 08-264794 A | 10/1996 |
| JP | 11-505377 A | 5/1999 |
| JP | 2000-044236 A | 2/2000 |
| JP | 2000-058762 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure,"NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Au. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 12A
FIG. 12D
FIG. 12B
FIG. 12E
FIG. 12C
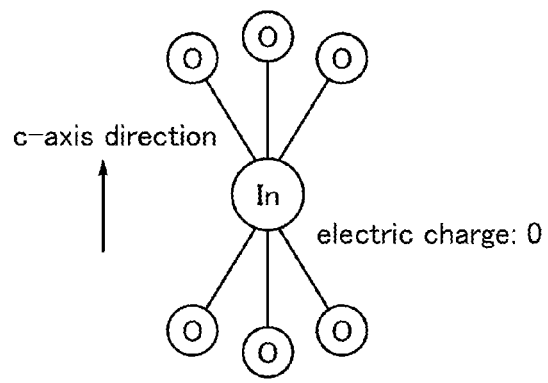
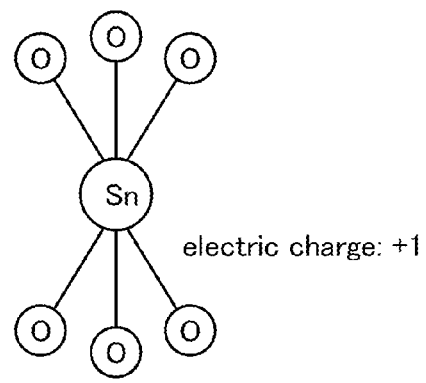
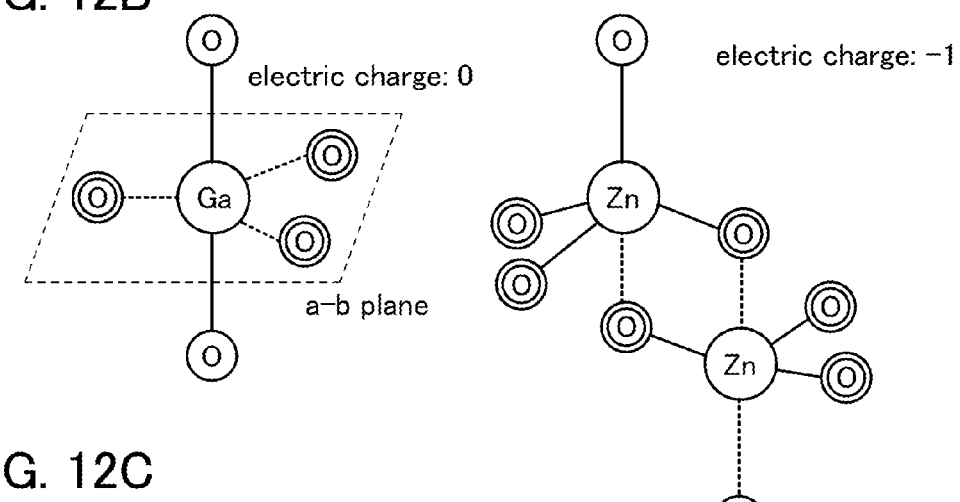
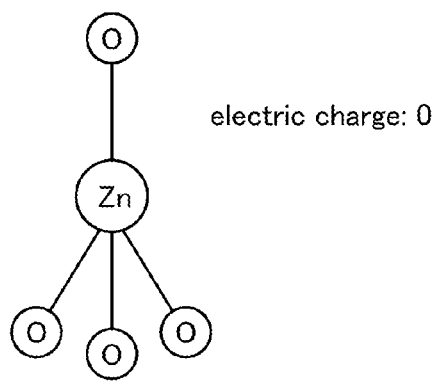

● In
☾ Sn
☽ Zn
● O

● In
● Ga
● Zn
● O

SEMICONDUCTOR DEVICE

BACKGROUND OF THE INVENTION

1. Field of the Invention

The present invention relates to a semiconductor device including a means for preventing a circuit from being damaged by application of unexpected high voltage due to electrostatic discharge or the like. Note that "semiconductor device" in this specification indicates all devices that can operate by utilizing semiconductor characteristics. For example, a display device, an imaging device, a memory device, an arithmetic device, and electronic devices using such devices are all semiconductor devices.

2. Description of the Related Art

In a semiconductor circuit used in a semiconductor device, a semiconductor element, an electrode, or the like could be damaged by electrostatic discharge (hereinafter referred to as "ESD"). As a measure to prevent damage of a semiconductor circuit due to ESD, a protection circuit is connected to a semiconductor circuit in many cases. A protection circuit refers to a circuit for preventing overvoltage applied to a terminal, a wiring, or the like from being supplied to a semiconductor circuit. As typical examples of an element used in the protection circuit, there are a resistor, a diode, a transistor, and a capacitor.

Further, in the case where the protection circuit is provided, even when noise as well as a signal and power supply voltage is input to a wiring or the like, a malfunction of a semiconductor circuit in a later stage due to the noise can be prevented and deterioration or damage of the semiconductor element due to the noise can be prevented.

For example, Patent Document 1 discloses a technique in which a protection circuit including a resistor and a diode is connected between a semiconductor circuit and a connection terminal in order to smooth a surge current generated due to ESD and secure a discharge path of the surge current, whereby inflow of the surge current into the semiconductor circuit is prevented.

Further, Patent Document 2 discloses a technique of connecting a protection circuit in which a MOS transistor whose source and gate are short-circuited and a MOS transistor whose gate and drain are short-circuited are connected in series between a scan electrode of a display device and a conductive line provided in the periphery of a display portion.

REFERENCE

Patent Document

[Patent Document 1] Japanese Published Patent Application No. 2000-58762
[Patent Document 2] Japanese Published Patent Application No. H7-092448

SUMMARY OF THE INVENTION

With the progress of miniaturization and integration of a semiconductor device, it is desired to reduce the area of a protection circuit. However, miniaturization of an element used in the protection circuit may lower the surge immunity and thereby the protection circuit itself may break in some cases.

An element (a diode, a transistor, etc.) using silicon, which is a typical semiconductor material, has a relatively large leak current in an off state. Therefore, in the case where a protection circuit including such an element is connected between a wiring (e.g., a signal line) connected to a semiconductor circuit and a power supply line, a leak current may flow between the wirings to change the potentials of the wirings or the power supply potential, causing unstable operation of the semiconductor device.

An object of an embodiment of the present invention is to provide a protection circuit having a small area and redundancy. Further, another object is to provide a protection circuit with small leak current.

An embodiment of the present invention disclosed in this specification relates to a semiconductor device which includes a protection circuit including a semiconductor element using silicon and a semiconductor element using an oxide semiconductor.

An embodiment of the present invention disclosed in this specification is a semiconductor device which includes, over a substrate, a first wiring; a second wiring; a third wiring; a first protection circuit including a first nonlinear element and a third nonlinear element; and a second protection circuit including a second nonlinear element and a fourth nonlinear element. In the first protection circuit, the first nonlinear element and the third nonlinear element are stacked in this order from the substrate side so as to overlap with each other and are electrically connected in series. In the second protection circuit, the second nonlinear element and the fourth nonlinear element are stacked in this order from the substrate side so as to overlap with each other and are electrically connected in series. The first protection circuit is electrically connected between the first wiring and the second wiring so that a forward bias is applied to the first nonlinear element and the third nonlinear element included in the first protection circuit when a potential of the first wiring is higher than a potential of the second wiring. The second protection circuit is electrically connected between the first wiring and the third wiring so that a forward bias is applied to the second nonlinear element and the fourth nonlinear element included in the second protection circuit when the potential of the first wiring is lower than a potential of the third wiring.

Note that in this specification and the like, ordinal numbers such as "first" and "second" are used in order to avoid confusion among components and do not limit the components numerically.

The first wiring can be a signal line through which a signal is input to a semiconductor circuit. The second wiring can be a high-potential power supply line. The third wiring can be a low-potential power supply line or a ground potential line.

Transistors including silicon in their respective channel formation regions can be used as the first nonlinear element and the second nonlinear element. Transistors including a compound semiconductor in their respective channel formation regions can be used as the third nonlinear element and the fourth nonlinear element. In particular, when an oxide semiconductor is used as the compound semiconductor, the off-state current of the transistors can be extremely small. Accordingly, when the transistors are used in the protection circuit connected between the wirings, the leak current between the wirings can be reduced.

Further, the transistors including silicon are preferably p-channel transistors with small off-state current. Note that the first to fourth nonlinear elements are each a two-terminal element in which one terminal is formed by short-circuiting one of a drain and a source and a gate electrode and the other of the drain and the source serves as the other terminal.

The first nonlinear element and the second nonlinear element may be diodes including silicon.

A protection circuit which is an embodiment of the present invention has a structure in which a plurality of nonlinear elements is stacked, whereby the area of the protection circuit can be small. Further, since the plurality of nonlinear elements is electrically connected in series, the protection circuit has redundancy for short-circuit defects. By using a transistor including an oxide semiconductor as at least one of the nonlinear elements in the protection circuit, leak current between wirings, between which the protection circuit is connected, can be reduced; as a result, the power supply potential or the potential of a signal can be stabilized.

BRIEF DESCRIPTION OF THE DRAWINGS

In the accompanying drawings:

FIGS. 12A to 12E show crystal structures of oxide materials;

DETAILED DESCRIPTION OF THE INVENTION

Figure 1:
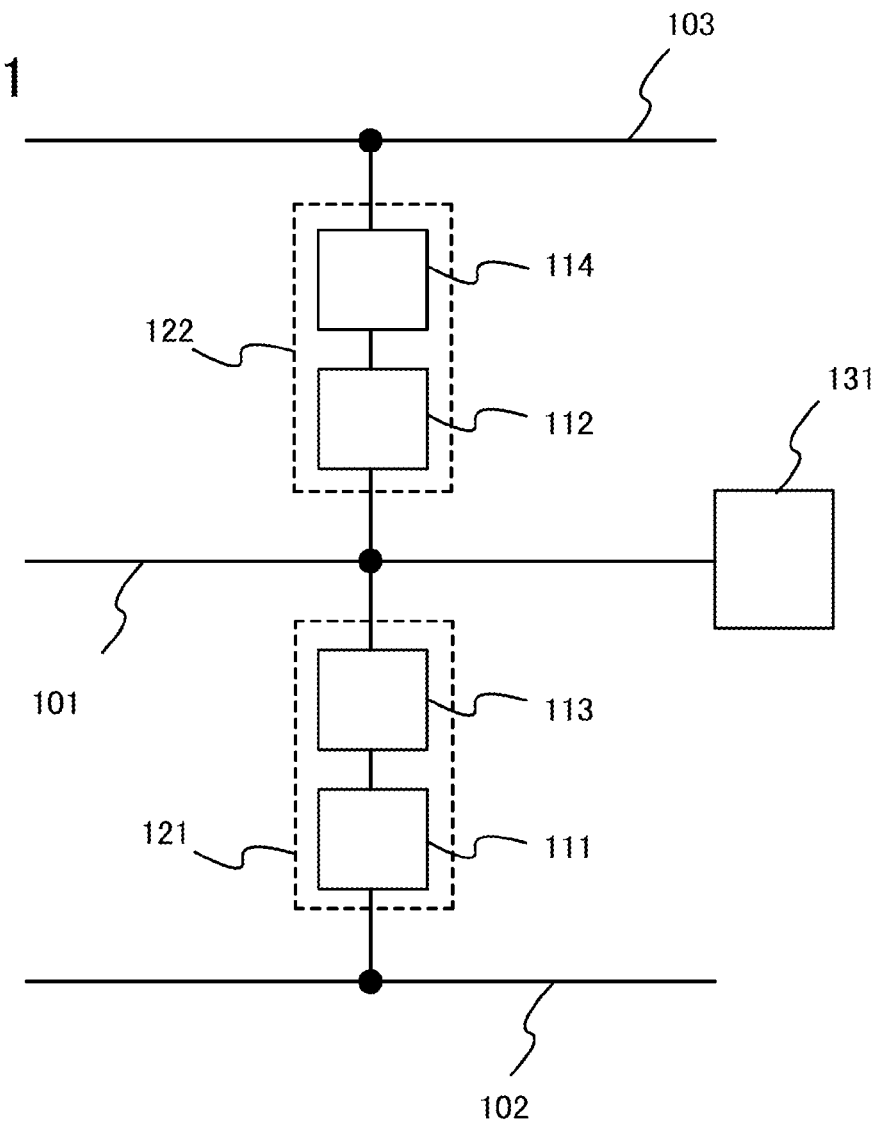
FIG. 1 illustrates protection circuits used in a semiconductor device and a mode of connection between the protection circuits and wirings.

Embodiments and Examples will be described in detail with reference to the accompanying drawings. Note that the invention is not limited to the following description, and it will be easily understood by those skilled in the art that various changes and modifications can be made without departing from the spirit and scope of the invention. Therefore, the present invention should not be limited to the descriptions of the embodiments and the examples below. Note that, in the structures of the invention described below, in some cases, the same portions or portions having similar functions are denoted by the same reference numerals in different drawings, and the descriptions of such portions are not repeated.

Note that in each drawing described in this specification, the size, the layer thickness, or the region of each component is exaggerated for clarity in some cases. Therefore, embodiments of the present invention are not necessarily limited to such scales.

(Embodiment 1)

In this embodiment, a configuration of protection circuits used in a semiconductor device according to an embodiment of the present invention and an operation method of the protection circuits will be described.

FIG. 1 illustrates protection circuits used in a semiconductor device according to an embodiment of the present invention and a mode of connection between the protection circuits and wirings. A first protection circuit 121 includes a first nonlinear element 111 and a third nonlinear element 113. A second protection circuit 122 includes a second nonlinear element 112 and a fourth nonlinear element 114. The semiconductor device according to an embodiment of the present invention includes a first wiring 101 connected to a semiconductor circuit 131, a second wiring 102, and a third wiring 103. The first protection circuit 121 is electrically connected between the first wiring 101 and the second wiring 102, and the second protection circuit 122 is electrically connected between the first wiring 101 and the third wiring 103.

The first wiring 101 can serve as a signal line through which a signal is input to the semiconductor circuit 131, the second wiring 102 can serve as a high-potential power supply line (VDD), and the third wiring 103 can serve as a low-potential power supply line (VSS) or a ground potential line (GND).

The above-described nonlinear elements refer to elements in which current flowing therethrough is not proportional to a voltage applied thereto. In the case of a diode for example, when the potential of an anode is set higher than that of a cathode, a forward bias is applied, which facilitates current flow. On the other hand, when the potential of the cathode is set higher than that of the anode, a reverse bias is applied; at this time, current can hardly flow as compared to the case of the forward bias application.

The first protection circuit 121 includes the first nonlinear element 111 and the third nonlinear element 113 connected in series, and is connected between the first wiring 101 and the second wiring 102 so that a forward bias is applied to the two nonlinear elements when the potential of the first wiring 101 is higher than that of the second wiring 102.

The second protection circuit 122 includes the second nonlinear element 112 and the fourth nonlinear element 114 connected in series, and is connected between the first wiring 101 and the third wiring 103 so that a forward bias is applied to the two nonlinear elements when the potential of the first wiring 101 is lower than that of the third wiring 103.

In the case of connecting the first protection circuit 121 and the second protection circuit 122 to the first wiring 101 in this manner, the protection circuits serve as a discharge path even when a high surge voltage such as ESD is applied to the first wiring 101; accordingly, inflow of the surge current into the semiconductor circuit 131 can be prevented.

For example, in the case where a positive surge voltage is applied to the first wiring 101, a forward bias is applied to the first protection circuit 121, whereby current flows from the first wiring 101 to the second wiring 102. In the case where a negative surge voltage is applied to the first wiring 101, a forward bias is applied to the second protection circuit 122, whereby current flows from the third wiring 103 to the first wiring 101. In this manner, electric charge supplied to the first wiring 101 by ESD or the like can be canceled and unwanted inflow of electric charge into the semiconductor circuit 131 can be prevented.

Figure 2:
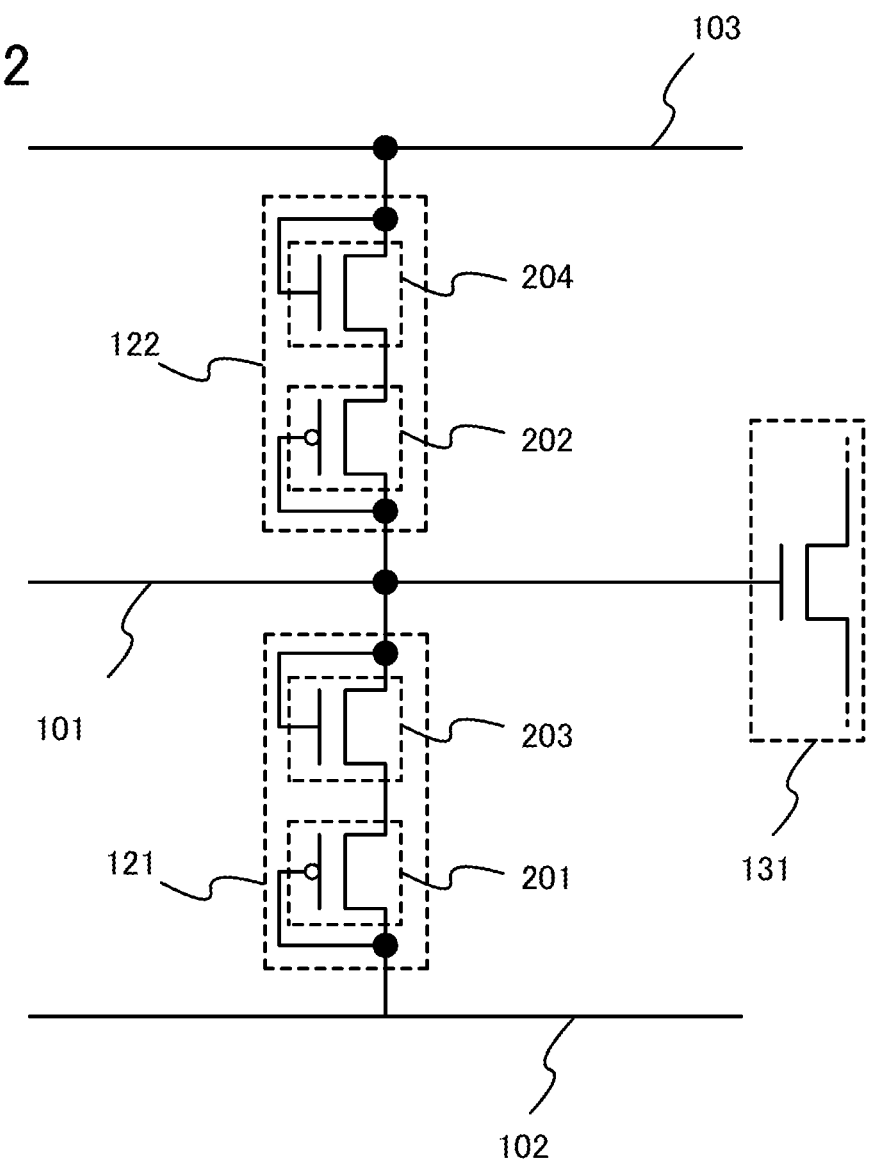
FIG. 2 is a circuit diagram of protection circuits used in a semiconductor device.
Figure 3:
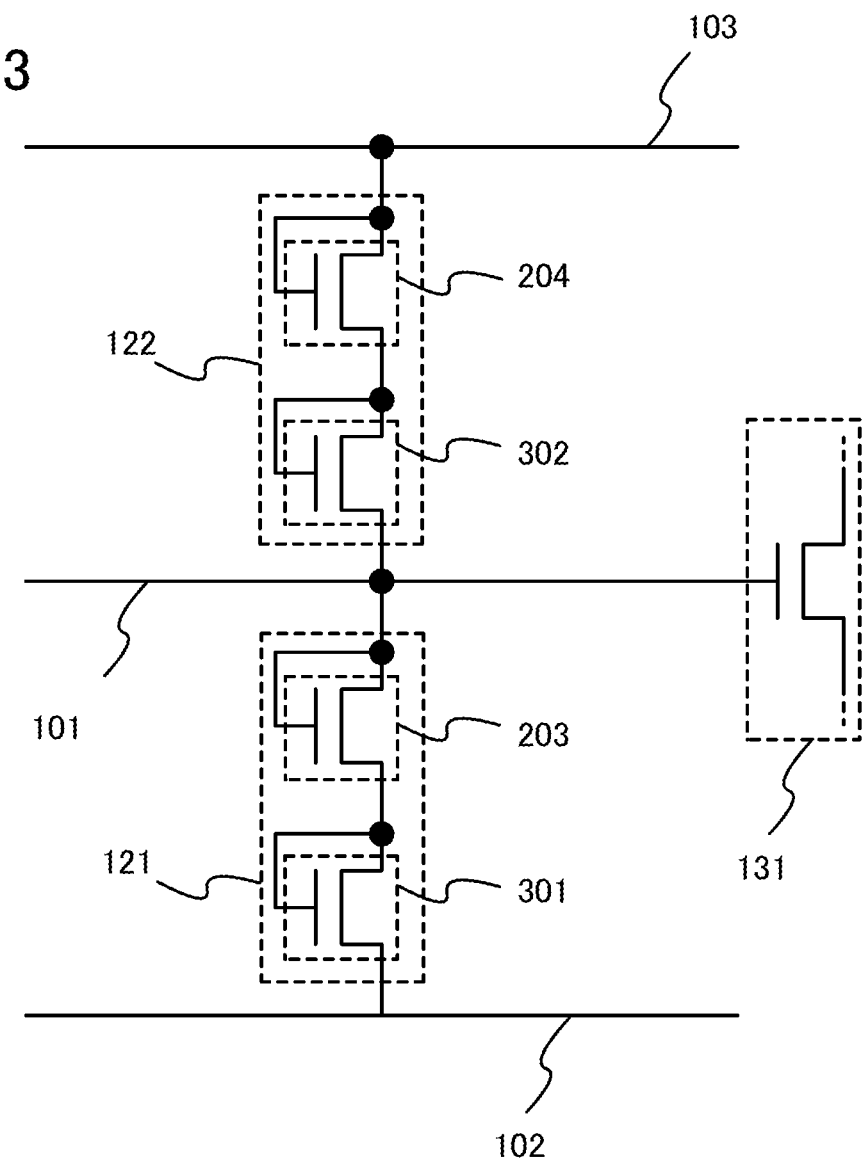
FIG. 3 is a circuit diagram of protection circuits used in a semiconductor device.

Next, a specific example of the protection circuits will be described. FIG. 2 illustrates an example in the case where diode-connected transistors, in each of which one of a drain electrode and a source electrode and a gate electrode are short-circuited, are used as the nonlinear elements in the first protection circuit 121 and the second protection circuit 122. In the example of FIG. 2, p-channel transistors are used as a first nonlinear element 201 and a second nonlinear element 202, and n-channel transistors are used as a third nonlinear element 203 and a fourth nonlinear element 204. In an embodiment of the present invention, transistors that include silicon in their respective channel formation regions are employed as the first nonlinear element 201 and the second nonlinear element 202. For that reason, the first nonlinear element 201 and the second nonlinear element 202 are preferably p-channel transistors, which have a smaller off-state current than n-channel transistors. However, n-channel transistors may be employed as in the case of a first nonlinear element 301 and a second nonlinear element 302 illustrated in FIG. 3.

Figure 4:
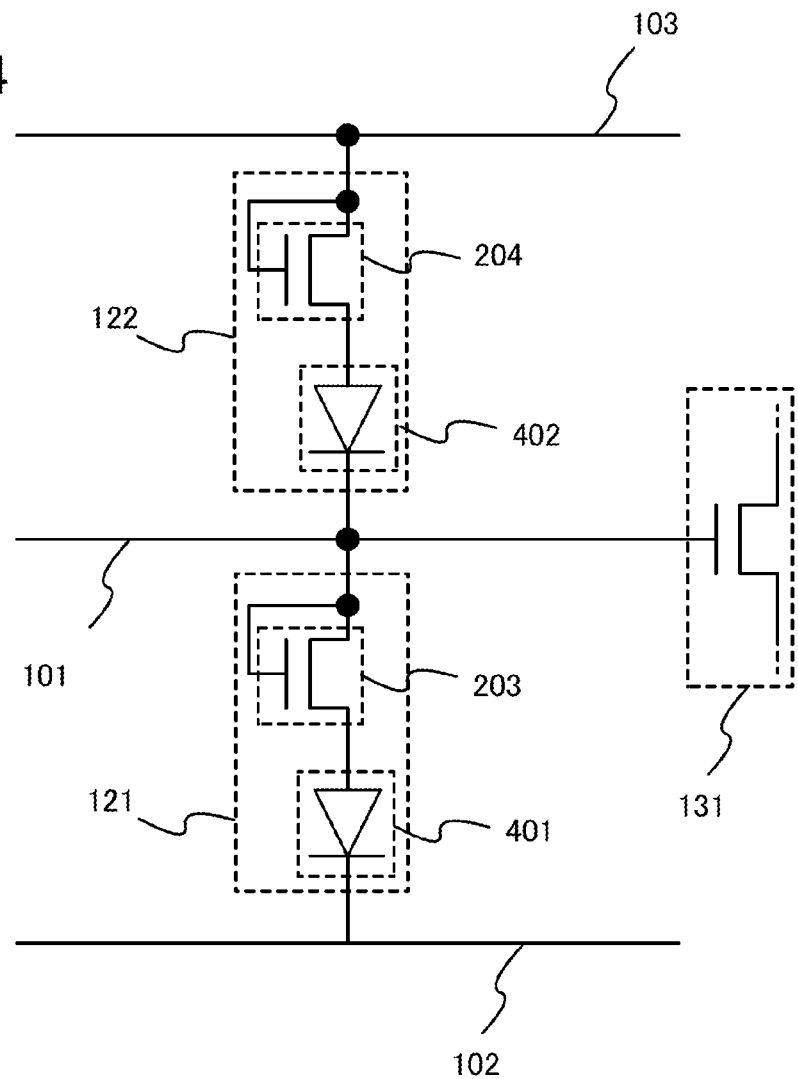
FIG. 4 is a circuit diagram of protection circuits used in a semiconductor device.

As illustrated in FIG. 4, a first nonlinear element 401 and a second nonlinear element 402 may be diodes that include silicon in their respective junction regions. Note that the structures of FIG. 2, FIG. 3, and FIG. 4 can be combined freely. For example, the first protection circuit 121 may be formed of an n-channel transistor and a p-channel transistor, and the second protection circuit 122 may be formed of two n-channel transistors.

The number of nonlinear elements included in each of the protection circuits is two or more, and the two-or-more nonlinear elements are electrically connected in series. By including plural nonlinear elements, the protection circuit can serve its own function even in the case where short circuit due to a process failure in the manufacturing process, damage by ESD, or the like arises in one nonlinear element. In other words, redundancy can be achieved. At least one of the nonlinear elements is preferably a transistor having an extremely small off-state current, which will be described later. Further, the protection circuit may have a structure in which, when a plurality of nonlinear elements connected in series is considered as one unit, a plurality of such units is connected in parallel. The parallel connection of the nonlinear elements enables much current to flow through the protection circuit as a whole, whereby damage to the nonlinear elements can be prevented.

The plurality of nonlinear elements is provided in the protection circuit so that the nonlinear elements overlap with each other and the area occupied by the nonlinear elements is as small as possible. By thus providing the plurality of nonlinear elements so as to overlap with each other, the area of the protection circuit can be reduced.

Note that in normal operation, a reverse bias is applied to the nonlinear elements in the protection circuits or the difference between potentials of the wirings does not exceed an operation voltage of the nonlinear elements; therefore, the protection circuits do not operate basically. However, a slight amount of current flows even when a reverse bias is applied and thereby a leak current flows between the wirings, which may change the potentials of the power supply lines or the potential of the signal line.

In particular, the reverse current or the off-state current is relatively large in a diode or a transistor that uses silicon, so that change in the potentials of the above-described wirings is likely to occur. Therefore, in an embodiment of the present invention, a transistor having an extremely small off-state current is used as at least one nonlinear element in each of the protection circuits.

An example of the transistor having an extremely small off-state current is a transistor in which a semiconductor having a wider band gap than silicon is used for a channel formation region. As the semiconductor having a wider band gap than silicon, a compound semiconductor can be given. Well-known examples of the compound semiconductor are an oxide semiconductor, a nitride semiconductor, and the like.

Specifically, in order to obtain extremely high off-state resistance, silicon (band gap: 1.1 eV) is not enough. It is favorable to use a wide band gap semiconductor having a band gap of greater than or equal to 2.5 eV and less than or equal to 4 eV, preferably greater than or equal to 3 eV and less than or equal to 3.8 eV. For example, for the semiconductor layer in which a channel is formed, an oxide semiconductor such as indium oxide or zinc oxide, a nitride semiconductor such as gallium nitride, a sulfide semiconductor such as zinc sulfide, or the like can be used.

The off-state resistance of a semiconductor layer, in which a channel is formed, of a transistor is inversely proportional to the concentration of carriers excited thermally. Since the band gap of silicon is 1.1 eV even when carriers caused by a donor or an acceptor do not exist at all (intrinsic semiconductor), the concentration of thermally excited carriers at room temperature (300 K) is approximately $1 \times 10^{11}$ cm$^{-3}$.

In contrast, the concentration of thermally excited carriers of a semiconductor having a band gap of 3.2 eV is approximately $1 \times 10^{-7}$ cm$^{-3}$. When the electron mobility is the same, the resistivity is inversely proportional to the carrier concentration, so that the resistivity of the semiconductor having a band gap of 3.2 eV is 18 orders of magnitude higher than that of silicon. As such a compound semiconductor, an In—Ga—Zn—O-based oxide semiconductor and an In—Sn—Zn—O-based oxide semiconductor are known for example.

For this reason, when a transistor formed using the compound semiconductor as described above is used as one nonlinear element in a protection circuit, even if another nonlinear element connected to the nonlinear element in series is formed using silicon, leak current can be made small. Accordingly, a change in the potential of a wiring to which the protection circuit is connected can be suppressed. That is, in the protection circuits having the structures of FIG. 2, FIG. 3, and FIG. 4, it is preferable to use transistors formed using a compound semiconductor as the third nonlinear element 203 and the fourth nonlinear element 204.

A semiconductor device according to an embodiment of the present invention preferably has such a structure that an element formed using a compound semiconductor (e.g., oxide semiconductor) is provided over an element formed using silicon. With this structure, a special step is not necessary for forming the protection circuits: the protection circuits can be formed through the same process as other elements. Of course, a structure in which a compound semiconductor is used only for the protection circuits may be employed as well.

Examples of the semiconductor device include a display device or imaging device whose driver circuit portion is formed using an element that includes silicon and whose pixel circuit portion is formed using an element that includes a compound semiconductor; a memory device whose memory circuit portion is formed using an element that includes silicon and an element that includes a compound semiconductor; and a memory device or arithmetic device whose driver circuit portion or arithmetic circuit portion is formed using an element that includes silicon and whose memory circuit portion is formed using an element that includes a compound semiconductor. The semiconductor device has improved potential holding property in a potential holding portion, by making use of extremely small off-state current characteristics of the element that includes a compound semiconductor.

This embodiment can be implemented in appropriate combination with any of the other embodiments disclosed in this specification.

(Embodiment 2)

In this embodiment, an example of a method for manufacturing the protection circuits described in Embodiment 1 will be described. Note that in this embodiment, a method for manufacturing top-gate transistors including an oxide semiconductor in a non-self-aligned manner will be described as an example. However, the structure of the transistor is not limited thereto, and top-gate transistors may be manufactured in a self-aligned manner or bottom-gate transistors may be manufactured.

First, an element formation region isolated with an insulating layer 540 (also referred to as a field oxide film) is formed in a single crystal silicon substrate 500. An element isolation region can be formed by local oxidation of silicon (LOCOS), shallow trench isolation (STI), or the like.

Here, the substrate is not limited to the single crystal silicon substrate. A silicon on insulator (SOI) substrate or the like can be used as well.

Next, a first insulating layer 536 serving as a gate insulating layer is formed to cover the element formation region. For example, a silicon oxide film can be formed by oxidation of a surface of the element formation region provided in the single crystal silicon substrate 500 using heat treatment. Alternatively, the first insulating layer 536 may have a stacked structure of a silicon oxide film and a film containing oxygen and nitrogen (silicon oxynitride film) by forming a silicon oxide film using thermal oxidation and nitriding a surface of the silicon oxide film using nitriding treatment.

As another method, high-density plasma treatment may be performed on the surface of the element formation region provided in the single crystal silicon substrate 500 to oxidize or nitride the surface, so that a silicon oxide film or a silicon nitride film can be formed as the first insulating layer 536. Further, after oxidation treatment is performed on the surface of the element formation region by high-density plasma treatment, nitriding treatment may be performed by high-density plasma treatment. In this case, a silicon oxide film is formed on and in contact with the surface of the element formation region and a silicon oxynitride film is formed over the silicon oxide film; thus the first insulating layer 536 has a stacked structure of the silicon oxide film and the silicon oxynitride film.

Next, a conductive layer is formed so as to cover the first insulating layer 536. Here, a conductive layer 538a and a conductive layer 538b are sequentially stacked. Here, without limiting the two-layer structure, the conductive layer may have a single-layer structure or a stacked structure of three or more layers.

As a material of the conductive layers 538a and 538b, an element selected from tantalum (Ta), tungsten (W), titanium (Ti), molybdenum (Mo), aluminum (Al), copper (Cu), chromium (Cr), and niobium (Nb), or an alloy or compound material containing the element as its main component can be used. Alternatively, a metal nitride film obtained by nitridation of any of those elements can be used. Further alternatively, a semiconductor material typified by polycrystalline silicon doped with an impurity element such as phosphorus can also be used.

Here, the conductive layer 538a is formed using tantalum nitride, and the conductive layer 538b is formed using tungsten over the conductive layer 538a. The conductive layer 538a can have a single-layer structure or a stacked structure of a material selected from tungsten nitride, molybdenum nitride, and titanium nitride. The conductive layer 538b can have a single-layer structure or a stacked structure of an element selected from tantalum, molybdenum, and titanium.

Next, the stacked conductive layers 538a and 538b are selectively etched, so that gate electrodes 538 and 558 are formed over the first insulating layer 536.

Next, a resist mask is selectively formed so as to cover regions except the element formation region, and $p^+$ regions 532a, 532b, 552a, and 552b are formed by introduction of an impurity element with the use of the resist mask and the gate electrodes 538 and 558 as masks. Here, in order to form p-channel bulk transistors, an impurity element imparting p-type conductivity such as boron (B) can be used as the impurity element.

Then, a second insulating layer 539 functioning as an interlayer insulating layer and a protective layer is formed. The second insulating layer 539 can be formed using a silicon oxide film, a silicon nitride film, a silicon oxynitride film, a silicon nitride oxide film, or the like.

Figure 5A:
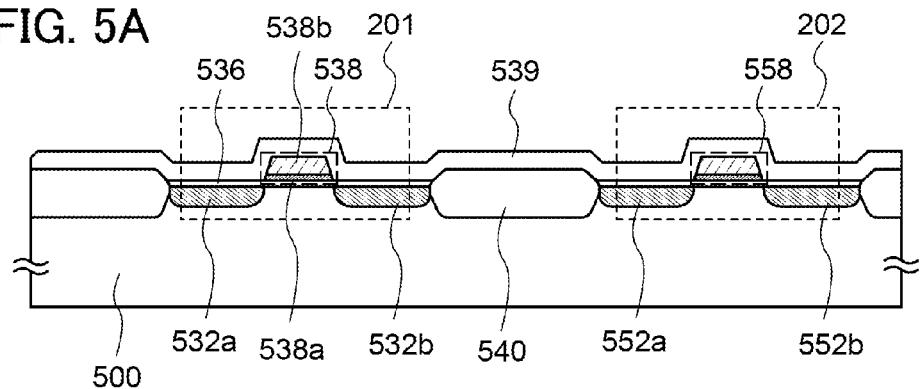
FIGS. 5A to 5C are process cross-sectional views illustrating a method for manufacturing protection circuits used in a semiconductor device.

At this stage, a structure including the first nonlinear element 201 and the second nonlinear element 202, which are transistors including silicon in their respective channel formation regions, is completed as illustrated in FIG. 5A.

Next, contact holes reaching source regions, drain regions, and the gate electrodes 538 and 558 of the first nonlinear element 201 and the second nonlinear element 202 are formed in the second insulating layer 539. The contact holes can be formed by a known photolithography method and a known etching method.

Connection wirings 541a, 541b, 561a, and 561b are formed. The connection wiring 541a causes short-circuit between one of the source region and the drain region of the first nonlinear element 201 and the gate electrode 538 thereof. The connection wiring 561a causes short-circuit between one of the source region and the drain region of the second nonlinear element 202 and the gate electrode 558 thereof.

The connection wirings can be formed in such a manner that a conductive film is formed by a deposition method such as a sputtering method and then subjected to a known photolithography method and a known etching method. As a material of the conductive film, an element selected from aluminum, chromium, copper, tantalum, titanium, molybdenum, and tungsten, an alloy containing any of these elements as a component, an alloy containing any of these elements in combination, or the like can be used. Further, the conductive film may have a single-layer structure or a stacked structure of two or more layers. Alternatively, a structure may be employed in which a film of a refractory metal such as chromium, tantalum, titanium, molybdenum, or tungsten is stacked over and/or below a metal film of aluminum, copper, or the like. Further, one or more materials selected from manganese, magnesium, zirconium, beryllium, neodymium, and scandium may be used.

Figure 5B:
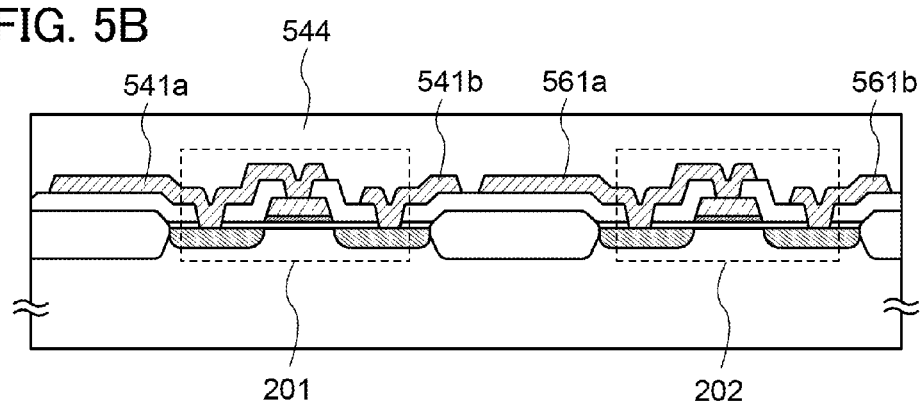

Next, a third insulating layer 544 functioning as an interlayer insulating layer and a planarization layer is formed over the connection wirings and the second insulating layer 539 (see FIG. 5B). The third insulating layer 544 can be formed by forming a silicon oxide film or the like using a plasma CVD method or a sputtering method and then performing planarization treatment using a chemical mechanical polishing (CMP) method or the like.

The third insulating layer 544 can be formed using an organic material having heat resistance, such as a polyimide-based resin, an acrylic-based resin, a benzocyclobutene-based resin, a polyamide-based resin, or an epoxy-based resin. Other than such organic materials, it is also possible to use a low-dielectric constant material (a low-k material), a siloxane-based resin, PSG (phosphosilicate glass), BPSG (borophosphosilicate glass), or the like. The third insulating layer 544 may be formed by stacking a plurality of insulating layers formed using the above materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The method for forming the third insulating layer 544 using any of these materials is not limited to a particular method, and any of the following methods or means can be used depending on the material: an SOG method, spin coating, dip coating, spray coating, a droplet discharge method (e.g., an inkjet method), screen printing, or offset printing; a doctor knife, a roll coater, a curtain coater, a knife coater, or the like.

Next, a method for manufacturing transistors including an oxide semiconductor layer, over the first nonlinear element 201 and the second nonlinear element 202 will be described.

First, a fourth insulating layer 521 is formed over the third insulating layer 544. The fourth insulating layer 521 has a function of suppressing diffusion of an impurity from layers positioned therebelow.

An insulating layer containing oxygen is preferably used as the fourth insulating layer 521. For example, the fourth insulating layer 521 can be formed to have a single-layer structure or a stacked structure using any of silicon oxide, gallium oxide, gallium aluminum oxide, gallium zinc oxide, silicon oxynitride, silicon nitride oxide, aluminum oxide, aluminum nitride, aluminum oxynitride, aluminum nitride oxide, and hafnium oxide, or a mixed material of them. An insulating layer containing oxygen is used as the fourth insulating layer 521, so that oxygen deficiency of an oxide semiconductor layer, which will be described later, can be compensated easily. The insulating layer can be formed by various deposition methods such as a plasma CVD method and a sputtering method.

Figure 5C:
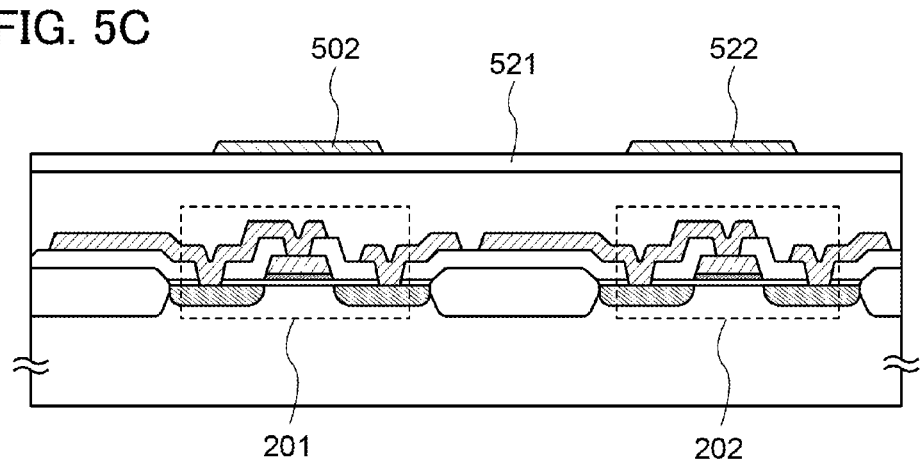

Next, semiconductor layers 502 and 522 are formed over the fourth insulating layer 521. In this embodiment, an In—Ga—Zn—O-based oxide semiconductor layer is formed by a sputtering method using an In—Ga—Zn—O-based oxide target, and processed into the island-shaped semiconductor layers 502 and 522 by a known photolithography method and a known etching method (see FIG. 5C).

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, as the oxide semiconductor, indium oxide; tin oxide; zinc oxide; a two-component metal oxide such as an In—Zn—based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as main components and there is no particular limitation on the ratio of In, Ga, and Zn. The In—Ga—Zn-based oxide may contain a metal element other than the In, Ga, and Zn.

As the oxide semiconductor, a material represented by $InMO_3(ZnO)_m$ (m>0, m is not an integer) may be used. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn= 2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3: 1/3:1/3), In:Sn:Zn=2:1:3 (=1/ 3:1/6:1/2), or In:Sn:Zn=2:1:5 (=1/4:1/8:5/8), or any of oxides whose composition is in the neighborhood of the above compositions can be used.

However, the composition is not limited to those described above, and a material having an appropriate composition may be used depending on required semiconductor characteristics (e.g., mobility, threshold voltage, and variation). In order to obtain required semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a: b: c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, a mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_2)$, and $(x_2, y_2)$), and $Z_0$ represents an average height of the plane to be measured. $R_a$ can be measured using an atomic force microscope (AFM).

As the deposition target used when the In—Ga—Zn—O-based oxide semiconductor layer is formed using a sputtering method, a metal oxide with the following composition ratio: $In_2O_3:Ga_2O_3:ZnO=1:1:1$ [molar ratio] can be used, for example. Alternatively, a metal oxide with the following composition ratio may be used: $In_2O_3:Ga_2O_3:ZnO=1:1:2$ [molar ratio].

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The composition ratio in an atomic ratio of an oxide semiconductor target used for formation of an In—Sn—Zn—O-based material film can be In:Sn:Zn=1:2:2, 2:1:3, 1:1:1, 20:45:35, or the like.

Here, the oxide semiconductor layer is preferably formed not to contain impurities such as an alkali metal, hydrogen atoms, hydrogen molecules, water, a hydroxyl group, and a hydrogen compound as much as possible. For example, the above impurities are prevented from entering a deposition gas and a target for sputtering deposition. In the case of using argon and oxygen for a sputtering gas, argon with a purity of 9N (the dew point: −121° C., $H_2O$: 0.1 ppb, $H_2$: 0.5 ppb) and oxygen with a purity of 8N (the dew point: −112° C., $H_2O$: 1 ppb, $H_2$: 1 ppb) are preferably used.

In addition, when a deposition apparatus is sufficiently evacuated during the deposition and the oxide semiconductor layer is deposited while the substrate is heated, the concentration of impurities included in the deposited oxide semiconductor layer can be lowered. Heat treatment may be performed on the oxide semiconductor layer to release moisture and hydrogen in the oxide semiconductor layer. Note that the heat treatment may be performed any time after the oxide semiconductor layer is formed. The concentration of hydrogen in the oxide semiconductor layer after the heat treatment is $5 \times 10^{19}/cm^3$ or less, preferably $5 \times 10^{18}/cm^3$ or less, so that an element, such as a transistor, with high electric characteristics and reliability of operation can be manufactured.

As the oxide semiconductor layer, a c-axis aligned crystalline oxide semiconductor (CAAC-OS) film which is an oxide semiconductor including a non-crystalline portion and a crystalline portion that is aligned in the c-axis direction may be used.

The CAAC-OS film is not completely single crystal nor completely amorphous. The CAAC-OS film is an oxide semiconductor layer with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor layer may be substituted with nitrogen.

In an oxide semiconductor having a crystal portion as the CAAC-OS film, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness (RA) of less than or equal to 1 nm, preferably less than or equal to 0.3 nm, further preferably less than or equal to 0.1 nm.

An example of a crystal structure of the CAAC-OS film will be described in detail with reference to FIGS. 12A to 12E, FIGS. 13A to 13C, and FIGS. 14A to 14C. In FIGS. 12A to 12E, FIGS. 13A to 13C, and FIGS. 14A to 14C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, 0 surrounded by a circle represents tetracoordinate O and O surrounded by a double circle represents tricoordinate O.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom in FIG. 12B has one proximate Ga atom in the downward direction, and the one O atom in the lower half has one proximate Ga atom in the upward direction. The one O atom in the upper half with respect to the tetracoordinate Zn atom in FIG. 12C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 13A:
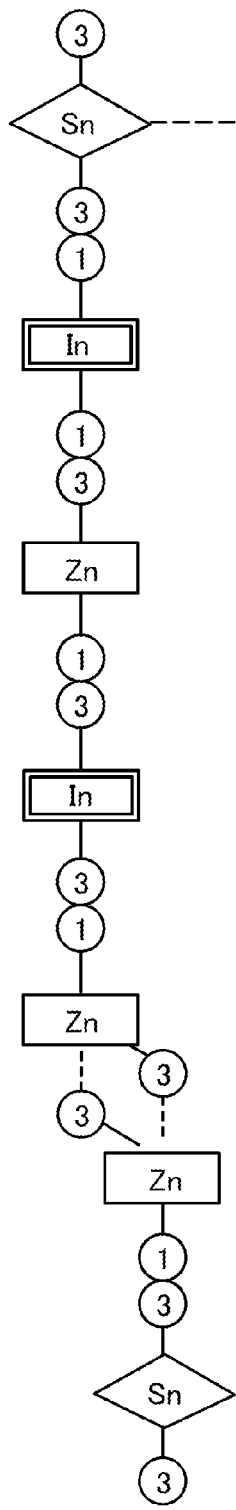
FIGS. 13A to 13C show a crystal structure of an oxide material.
Figure 13B:
Figure 13C:

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 14A:
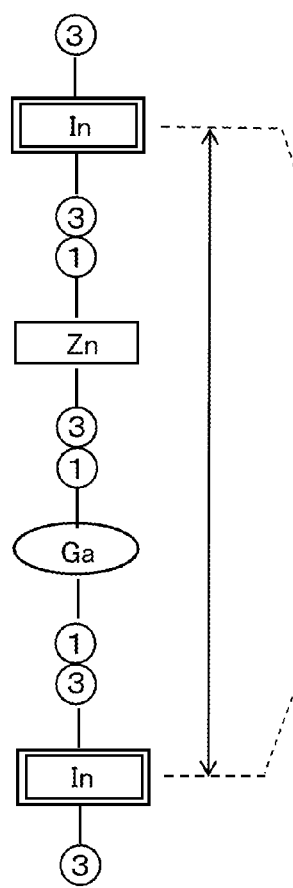
FIGS. 14A to 14C show a crystal structure of an oxide material.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 14B:
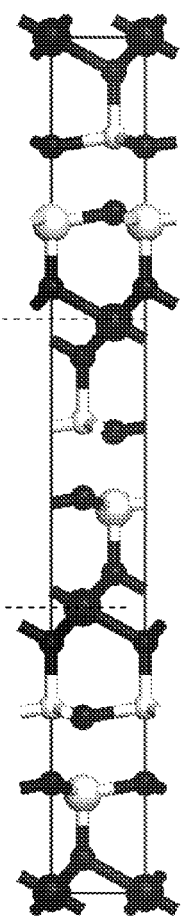
Figure 14C:
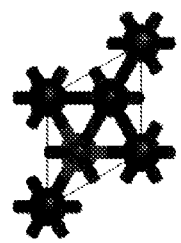

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

It is preferable that the CAAC-OS film be formed using a sputtering gas in which the flow rate of oxygen is increased. For example, in the case where argon and oxygen are used as the sputtering gas, the crystallinity of a crystal included in a CAAC-OS film can be improved and oxygen deficiency in the film can be compensated by setting the oxygen flow rate to higher than or equal to 30%. Further, when the film formation is performed at a temperature of higher than or equal to 150° C., the crystallinity of a crystal included in a CAAC-OS film can be further improved.

After the CAAC-OS film is formed, the heat treatment is performed under a nitrogen atmosphere or under a reduced pressure. After that, heat treatment is performed under an oxygen atmosphere or a mixed atmosphere of nitrogen and oxygen, so that the CAAC-OS film can contain oxygen excessively and thus the oxygen deficiency can be compensated effectively. Note that the heat treatment is preferably performed at a temperature of approximately 450° C.

The element, such as a transistor, including the above-described CAAC-OS film can have higher electric characteristics and reliability of operation.

Next, a contact hole reaching the connection wiring 541*b* and a contact hole reaching the connection wiring 561*b* are formed in the fourth insulating layer 521 and the third insulating layer 544. The contact holes can be formed by a known photolithography method and a known etching method.

Then, one electrode 504 of a source electrode and a drain electrode of the transistor, one electrode 524 of a source electrode and a drain electrode of the transistor, the other electrode 506 of the source electrode and the drain electrode, and the other electrode 526 of the source electrode and the drain electrode are formed. At this time, the other electrode 506 of the source electrode and the drain electrode is electrically connected to the connection wiring 541b through the contact hole, and the other electrode 526 of the source electrode and the drain electrode is electrically connected to the connection wiring 561b through the contact hole.

The source and drain electrodes can be formed in such a manner that a conductive film is formed by a deposition method such as a sputtering method and then subjected to a known photolithography method and a known etching method. The source and drain electrodes can be formed using the same material that is used for the connection wirings 541a, 541b, 561a, and 561b.

Figure 6A:
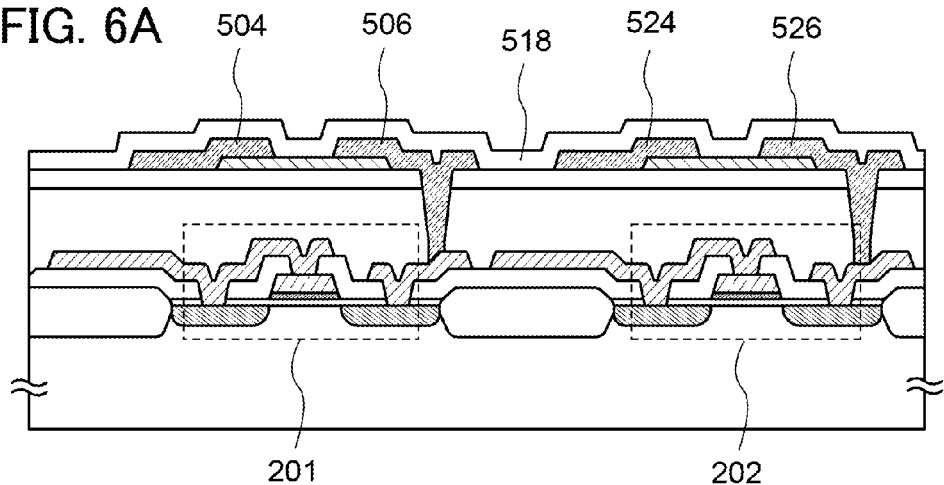
FIGS. 6A and 6B are process cross-sectional views illustrating a method for manufacturing protection circuits used in a semiconductor device.

Next, a fifth insulating layer 518 is formed as a gate insulating layer so as to cover the source and drain electrodes and the semiconductor layers 502 and 522 (see FIG. 6A). The fifth insulating layer 518 may have a single-layer structure or a stacked structure including any insulating layer of silicon oxide, silicon oxynitride, silicon nitride oxide, aluminum oxide, gallium oxide, gallium aluminum oxide, gallium zinc oxide, aluminum oxynitride, aluminum nitride oxide, hafnium oxide, tantalum oxide, yttrium oxide, lanthanum oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The insulating layer can be formed by a sputtering method or the like.

Next, gate electrodes 508 and 528 are formed so as to overlap with the semiconductor layers 502 and 522 respectively with the fifth insulating layer 518 interposed therebetween. The gate electrodes can be formed in such a manner that a conductive layer is formed by a deposition method such as a sputtering method and then subjected to a known photolithography method and a known etching method. The conductive layer can be formed using the same material that is used for the connection wirings 541a, 541b, 561a, and 561b.

Figure 6B:
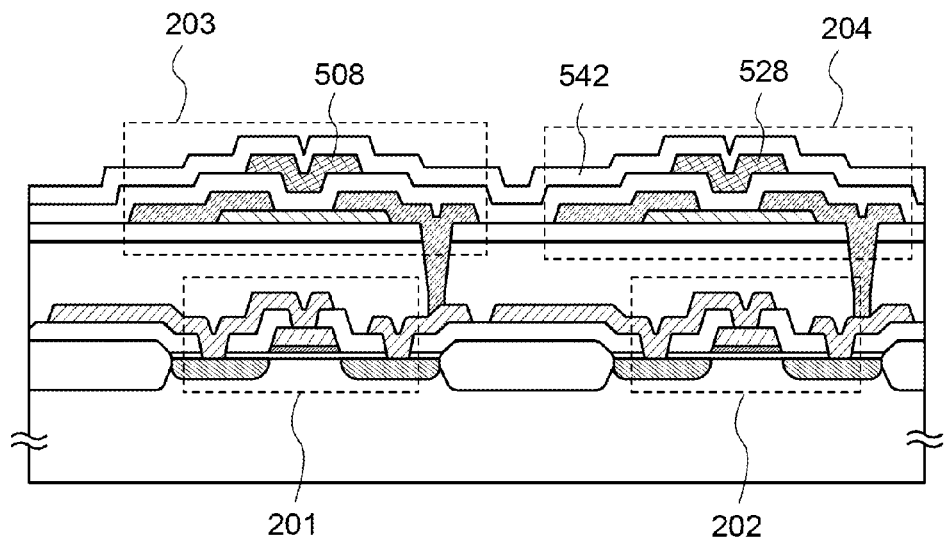

A sixth insulating layer 542 is formed over the fifth insulating layer 518 and the gate electrodes 508 and 528 (see FIG. 6B). The sixth insulating layer 542 functions as a protective layer and can be formed using the same material used for the fourth insulating layer 521. In particular, when aluminum oxide is used, oxygen in the semiconductor layers is unlikely to be released, whereby generation of oxygen deficiency can be suppressed.

At this stage, a structure including the third nonlinear element 203 and the fourth nonlinear element 204, which are transistors including an oxide semiconductor in their respective channel formation regions, is completed.

Next, contact holes reaching the one electrodes 504 and 524 of the source electrodes and the drain electrodes and the gate electrodes 508 and 528 of the third nonlinear element 203 and the fourth nonlinear element 204 from a surface of the sixth insulating layer 542 are formed. The contact holes can be formed by a known photolithography method and a known etching method.

Then, connection wirings 509 and 529 are formed. The connection wiring 509 causes short-circuit between the one electrode 504 of the source electrode and the drain electrode and the gate electrode 508 in the third nonlinear element 203. The connection wiring 529 causes short-circuit between the one electrode 524 of the source electrode and the drain electrode and the gate electrode 528 in the fourth nonlinear element 204.

The connection wirings can be formed in such a manner that a conductive film is formed by a deposition method such as a sputtering method and then subjected to a known photolithography method and a known etching method. The conductive film can be formed using the same material that is used for the connection wirings 541a, 541b, 561a, and 561b.

Figure 7A:
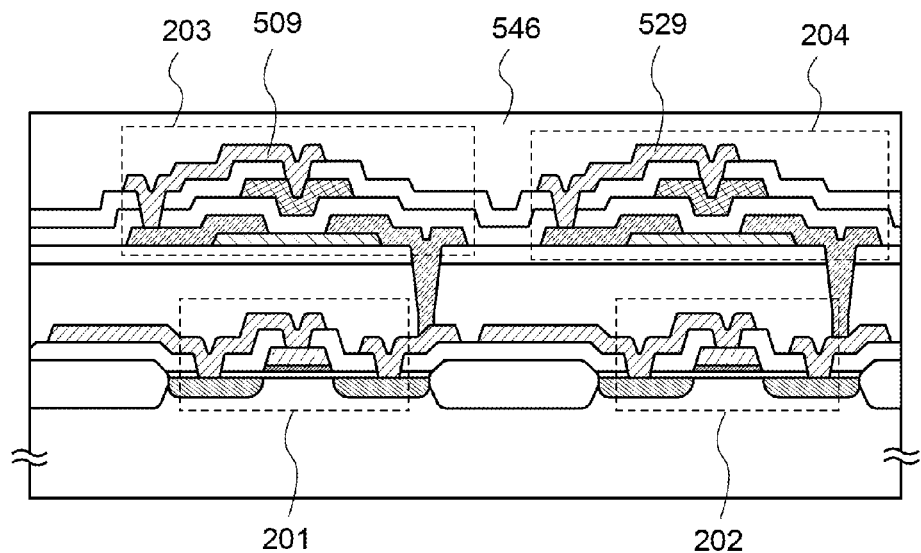
FIGS. 7A and 7B are process cross-sectional views illustrating a method for manufacturing protection circuits used in a semiconductor device.

Next, a seventh insulating layer 546 is formed so as to cover the connection wirings 509 and 529 and the sixth insulating layer 542 (see FIG. 7A). The seventh insulating layer 546 can be formed using a material and a method similar to those of the third insulating layer 544. FIG. 7A illustrates a state in which a surface of the seventh insulating layer 546 is planarized; however, the surface of the seventh insulating layer 546 is not necessarily planarized.

Then, a plurality of contact holes reaching the connection wirings 541a, 561a, 509, and 529 from the surface of the seventh insulating layer 546 is formed. The contact holes can be formed by a known photolithography method and a known etching method.

Figure 7B:
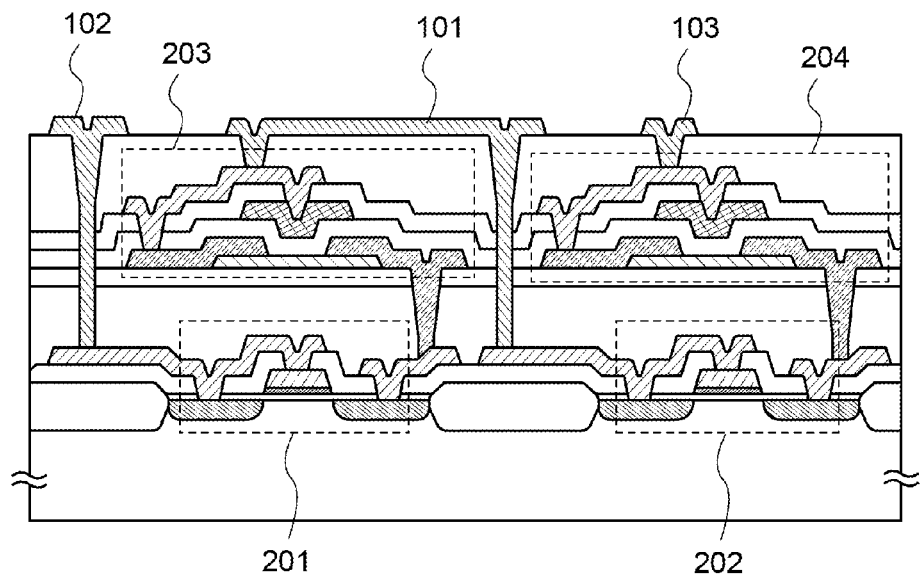

The second wiring 102 which is electrically connected to the connection wiring 541a through one of the contact holes, the first wiring 101 which is electrically connected to the connection wiring 561a and the connection wiring 509 through two of the contact holes, and the third wiring 103 which is electrically connected to the connection wiring 529 through one of the contact holes are formed (see FIG. 7B). Note that the first wiring 101, the second wiring 102, and the third wiring 103 may be separately provided and then connected to the connection wirings.

Through the above-described process, the protection circuit having the structure illustrated in FIG. 2 can be manufactured.

This embodiment can be implemented in appropriate combination with any of the other embodiments disclosed in this specification.

(Embodiment 3)

In this embodiment, a structure of a transistor, which is different from the structure described in the method for manufacturing a transistor including an oxide semiconductor in Embodiment 2 and which can be applied to the third nonlinear element 203 and the fourth nonlinear element 204 in Embodiments 1 and 2, will be described.

Figure 8A:
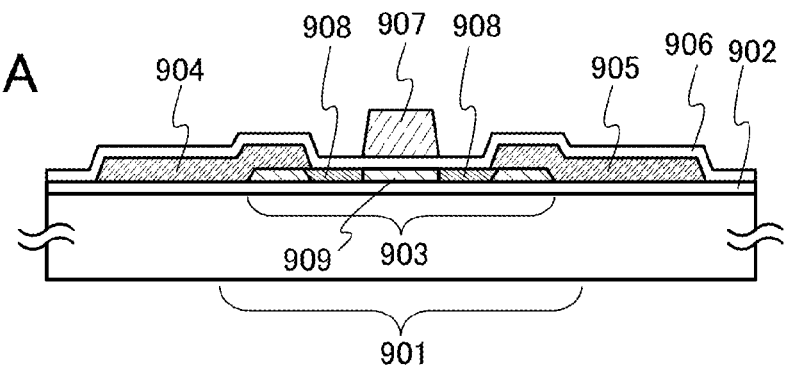
FIGS. 8A to 8D illustrate structures of transistors.

A transistor 901 illustrated in FIG. 8A includes, over an insulating layer 902, an oxide semiconductor layer 903 which functions as an active layer; a source electrode 904 and a drain electrode 905 which are formed over the oxide semiconductor layer 903; a gate insulating layer 906 over the oxide semiconductor layer 903, the source electrode 904, and the drain electrode 905; and a gate electrode 907 which is provided over the gate insulating layer 906 so as to overlap with the oxide semiconductor layer 903.

The transistor 901 illustrated in FIG. 8A is a top-gate transistor in which the gate electrode 907 is formed over the oxide semiconductor layer 903 and also is a top-contact transistor in which the source electrode 904 and the drain electrode 905 are formed over the oxide semiconductor layer 903. In the transistor 901, the source electrode 904 and the drain electrode 905 do not overlap with the gate electrode 907. A distance between the source electrode 904 and the gate electrode 907 and a distance between the drain electrode 905 and the gate electrode 907 are each larger than the thickness of the gate insulating layer 906. Accordingly, parasitic capacitance between the source electrode 904 and the gate electrode 907 and parasitic capacitance between the drain electrode 905 and the gate electrode 907 can be small, and thus high-speed operation can be achieved in the transistor 901.

The oxide semiconductor layer 903 includes a pair of high-concentration regions 908 which is obtained by addition of a dopant imparting n-type conductivity to the oxide semiconductor layer 903 after the gate electrode 907 is formed. Further, in the oxide semiconductor layer 903, a region which overlaps with the gate electrode 907 with the gate insulating layer 906 provided therebetween is a channel formation region 909. In the oxide semiconductor layer 903, the channel formation region 909 is provided between the pair of high-concentration regions 908. The dopant for forming the high-concentration regions 908 can be added by an ion implantation method. A rare gas such as helium, argon, or xenon; an atom belonging to Group 15, such as nitrogen, phosphorus, arsenic, or antimony; or the like can be used as the dopant.

For example, in the case where nitrogen is used as the dopant, the concentration of nitrogen atoms in the high-concentration regions 908 is preferably higher than or equal to $5\times10^{-19}/cm^3$ and lower than or equal to $1\times10^{22}/cm^3$.

The high-concentration regions 908 to which the dopant imparting n-type conductivity is added have higher conductivity than the other regions in the oxide semiconductor layer 903. Thus, the high-concentration regions 908 are provided in the oxide semiconductor layer 903, whereby the resistance between the source electrode 904 and the drain electrode 905 can be reduced.

In the case where an In—Ga—Zn—O-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source electrode 904 and the drain electrode 905 can be decreased. Note that in order to effectively decrease the resistance between the source electrode 904 and the drain electrode 905 by forming an oxide semiconductor having a wurtzite crystal structure, in the case of using nitrogen as the dopant, the concentration of nitrogen atoms in the high-concentration regions 908 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above-mentioned range.

Further, the oxide semiconductor layer 903 may be formed using a CAAC-OS film. When the oxide semiconductor layer 903 is formed using a CAAC-OS film, the conductivity of the oxide semiconductor layer 903 can be higher than that of an amorphous semiconductor film; therefore, the resistance between the source electrode 904 and the drain electrode 905 can be decreased.

The decrease in the resistance between the source electrode 904 and the drain electrode 905 ensures a high on-state current and high-speed operation even when the transistor 901 is miniaturized. Further, the miniaturization of the transistor 901 makes it possible to reduce the area occupied by an element including the transistor and increase the integration density of the semiconductor device.

Figure 11:
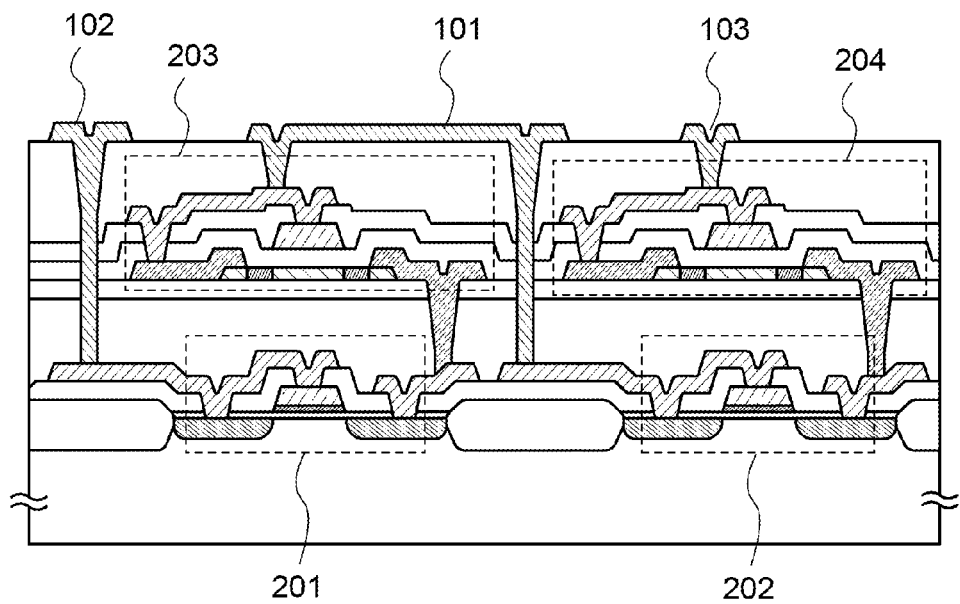
FIG. 11 is a cross-sectional view of protection circuits used in a semiconductor device.

FIG. 11 is a cross-sectional view in which the transistor 901 in FIG. 8A is applied to the third nonlinear element 203 and the fourth nonlinear element 204 in the protection circuits having the structure illustrated in FIG. 2. Not only the transistor in FIG. 8A as illustrated in FIG. 11 but also the transistors in FIGS. 8B, 8C, and 8D described below can be applied to the third nonlinear element 203 and the fourth nonlinear element 204 similarly.

Figure 8B:
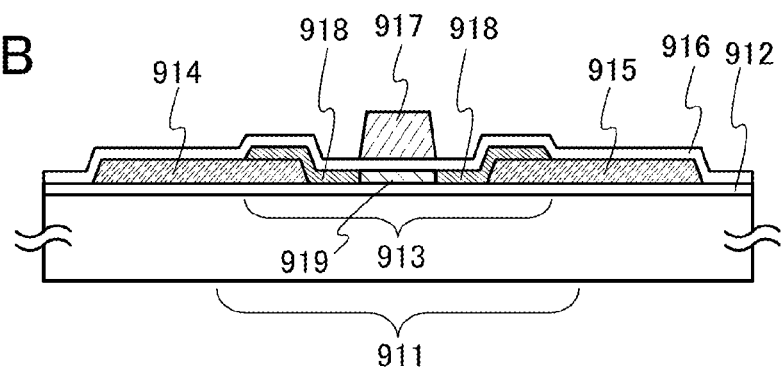

A transistor 911 illustrated in FIG. 8B includes a source electrode 914 and a drain electrode 915 which are formed over an insulating layer 912; an oxide semiconductor layer 913 which is formed over the source electrode 914 and the drain electrode 915 and functions as an active layer; a gate insulating layer 916 over the oxide semiconductor layer 913, the source electrode 914, and the drain electrode 915; and a gate electrode 917 which is provided over the gate insulating layer 916 so as to overlap with the oxide semiconductor layer 913.

The transistor 911 illustrated in FIG. 8B is a top-gate transistor in which the gate electrode 917 is formed over the oxide semiconductor layer 913, and also is a bottom-contact transistor in which the source electrode 914 and the drain electrode 915 are formed below the oxide semiconductor layer 913. As in the transistor 901, the source electrode 914 and the drain electrode 915 do not overlap with the gate electrode 917 in the transistor 911. Thus, parasitic capacitance between the source electrode 914 and the gate electrode 917 and parasitic capacitance between the drain electrode 915 and the gate electrode 917 can be reduced and high-speed operation can be achieved.

In addition, the oxide semiconductor layer 913 includes a pair of high-concentration regions 918 which is obtained by addition of a dopant imparting n-type conductivity to the oxide semiconductor layer 913 after the gate electrode 917 is formed. Further, in the oxide semiconductor layer 913, a region which overlaps with the gate electrode 917 with the gate insulating layer 916 provided therebetween is a channel formation region 919. The channel formation region 919 is provided between the pair of high-concentration regions 918 in the oxide semiconductor layer 913.

The high-concentration regions 918 can be formed by an ion implantation method in a manner similar to that of the high-concentration regions 908 included in the transistor 901. The description of the kinds of dopant used to form the high-concentration regions 908 can be referred to for the kinds of dopant used to form the high-concentration regions 918.

For example, in the case where nitrogen is used as the dopant, the concentration of nitrogen atoms in the high-concentration regions 918 is preferably higher than or equal to $5\times10^{19}/cm^3$ and lower than or equal to $1\times10^{22}/cm^3$.

The high-concentration regions 918 to which the dopant imparting n-type conductivity is added have higher conductivity than the other regions in the oxide semiconductor layer 913. Thus, the high-concentration regions 918 are provided in the oxide semiconductor layer 913, whereby the resistance between the source electrode 914 and the drain electrode 915 can be reduced.

In the case where an In—Ga—Zn—O-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above-mentioned range.

The oxide semiconductor layer 913 may be formed using a CAAC-OS film. When the oxide semiconductor layer 913 is formed using a CAAC-OS film, the conductivity of the oxide semiconductor layer 913 can be higher than that of an amorphous semiconductor film; therefore, the resistance between the source electrode 914 and the drain electrode 915 can be decreased.

The decrease in the resistance between the source electrode 914 and the drain electrode 915 ensures a high on-state current and high-speed operation even when the transistor 911 is miniaturized. Further, the miniaturization of the transistor 911 makes it possible to reduce the area occupied by an element including the transistor and increase the integration density of the semiconductor device.

Figure 8C:
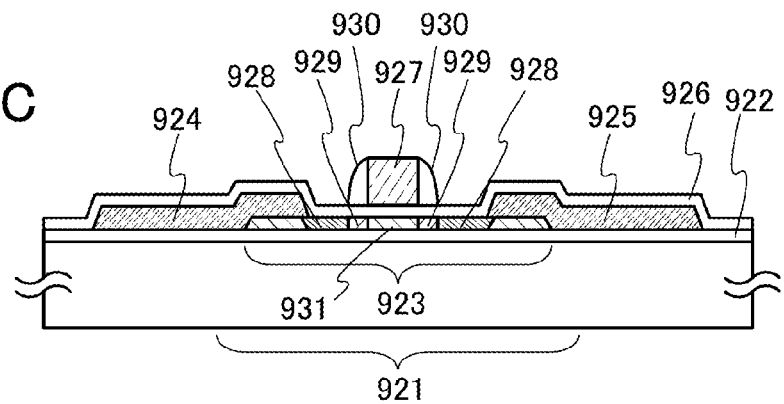

A transistor 921 illustrated in FIG. 8C includes an oxide semiconductor layer 923 which is formed over an insulating layer 922 and functions as an active layer; a source electrode 924 and a drain electrode 925 formed over the oxide semiconductor layer 923; a gate insulating layer 926 over the oxide semiconductor layer 923 and the source electrode 924 and the drain electrode 925; and a gate electrode 927 which is provided over the gate insulating layer 926 so as to overlap with the oxide semiconductor layer 923. In addition, the transistor 921 includes a sidewall 930 which is formed using an insulating layer and is provided on a side surface of the gate electrode 927.

The transistor 921 illustrated in FIG. 8C is of a top-gate type where the gate electrode 927 is formed over the oxide semiconductor layer 923, and is also of a top-contact type where the source electrode 924 and the drain electrode 925 are formed over the oxide semiconductor layer 923. In the transistor 921, the source electrode 924 and the drain electrode 925 do not overlap with the gate electrode 927 as in the transistor 901; thus, the parasitic capacitance generated between the gate electrode 927 and each of the source electrode 924 and the drain electrode 925 can be small, so that high speed operation can be achieved.

The oxide semiconductor layer 923 includes a pair of high-concentration regions 928 and a pair of low-concentration regions 929 which are obtained by addition of dopant imparting n-type conductivity to the oxide semiconductor layer 923 after formation of the gate electrode 927. Further, the oxide semiconductor layer 923 includes a channel formation region 931 which overlaps with the gate electrode 927 with the gate insulating layer 926 provided therebetween. In the oxide semiconductor layer 923, the channel formation region 931 is provided between the pair of low-concentration regions 929 which are provided between the pair of high-concentration regions 928. The pair of low-concentration regions 929 is provided in a region which is in the oxide semiconductor layer 923 and overlaps with the sidewall 930 with the gate insulating layer 926 provided therebetween.

Like the above-described high-concentration regions 908 included in the transistor 901, the high-concentration regions 928 and the low-concentration regions 929 can be formed by an ion implantation method. The description of the kinds of dopant used to form the high-concentration regions 908 can be referred to for the kinds of dopant used to form the high-concentration regions 928.

For example, in the case where nitrogen is used as the dopant, the concentration of nitrogen atoms in the high-concentration regions 928 is preferably higher than or equal to $5 \times 10^{19}/cm^3$ and lower than or equal to $1 \times 10^{22}/cm^3$, and the concentration of nitrogen atoms in the low-concentration regions 929 is preferably higher than or equal to $5 \times 10^{18}/cm^3$ and lower than $5 \times 10^{19}/cm^3$.

The high-concentration regions 928 to which the dopant imparting n-type conductivity is added have higher conductivity than the other regions in the oxide semiconductor layer 923. Therefore, by providing the high-concentration regions 928 in the oxide semiconductor layer 923, the resistance between the source electrode 924 and the drain electrode 925 can be decreased. The low-concentration regions 929 are provided between the channel formation region 931 and the high-concentration regions 928, so that a negative shift of the threshold voltage due to a short-channel effect can be reduced.

In the case where an In—Ga—Zn—O-based oxide semiconductor is used for the oxide semiconductor layer 923, heat treatment is performed at a temperature higher than or equal to 300° C. and lower than or equal to 600° C. after nitrogen is added. Consequently, the oxide semiconductor in the high-concentration regions 928 has a wurtzite crystal structure. Further, depending on the nitrogen concentration, the low-concentration regions 929 also have a wurtzite crystal structure due to the heat treatment. Since the oxide semiconductor in the high-concentration regions 928 has a wurtzite crystal structure, the conductivity of the high-concentration regions 928 can be further increased and the resistance between the source electrode 924 and the drain electrode 925 can be decreased. Note that in order to effectively decrease the resistance between the source electrode 924 and the drain electrode 925 by forming an oxide semiconductor having a wurtzite crystal structure, in the case of using nitrogen as the dopant, the concentration of nitrogen atoms in the high-concentration regions 928 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above-mentioned range.

The oxide semiconductor layer 923 may be formed using a CAAC-OS film. When the oxide semiconductor layer 923 is formed using a CAAC-OS film, the conductivity of the oxide semiconductor layer 923 can be higher than that of an amorphous semiconductor film; therefore, the resistance between the source electrode 924 and the drain electrode 925 can be decreased.

The decrease in the resistance between the source electrode 924 and the drain electrode 925 ensures a high on-state current and high-speed operation even when the transistor 921 is miniaturized. Further, the miniaturization of the transistor 921 makes it possible to reduce the area occupied by an element including the transistor and increase the integration density of the semiconductor device.

Figure 8D:
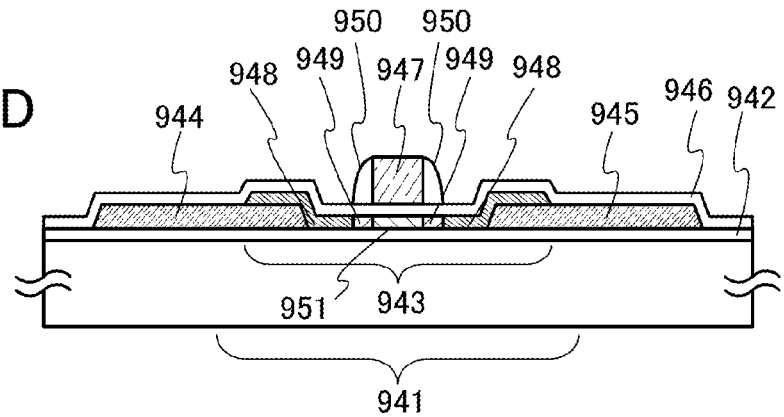

A transistor 941 illustrated in FIG. 8D includes a source electrode 944 and a drain electrode 945 formed over an insulating layer 942; an oxide semiconductor layer 943 which is formed over the source electrode 944 and the drain electrode 945 and functions as an active layer; a gate insulating layer 946 over the oxide semiconductor layer 943 and the source electrode 944 and the drain electrode 945; and a gate electrode 947 which is provided over the gate insulating layer 946 so as to overlap with the oxide semiconductor layer 943. In addition, the transistor 941 includes a sidewall 950 which is formed using an insulating layer and is provided on a side surface of the gate electrode 947.

The transistor 941 illustrated in FIG. 8D is of a top-gate type where the gate electrode 947 is formed over the oxide semiconductor layer 943, and is also of a bottom-contact type where the source electrode 944 and the drain electrode 945 are formed below the oxide semiconductor layer 943. In the transistor 941, the source electrode 944 and the drain electrode 945 do not overlap with the gate electrode 947 as in the transistor 901. Therefore, the parasitic capacitance generated between the gate electrode 947 and each of the source electrode 944 and the drain electrode 945 can be small, so that high speed operation can be achieved.

The oxide semiconductor layer 943 includes a pair of high-concentration regions 948 and a pair of low-concentration regions 949 which are obtained by addition of dopant imparting n-type conductivity to the oxide semiconductor layer 943 after formation of the gate electrode 947. Further, the oxide semiconductor layer 943 includes a channel formation region 951 which overlaps with the gate electrode 947 with the gate insulating layer 946 provided therebetween. In the oxide semiconductor layer 943, the channel formation region 951 is provided between the pair of low-concentration regions 949 which are provided between the pair of high-concentration regions 948. The pair of low-concentration regions 949 is provided in a region which is in the oxide semiconductor layer 943 and overlaps with the sidewall 950 with the gate insulating layer 946 provided therebetween.

Like the above-described high-concentration regions 908 included in the transistor 901, the high-concentration regions 948 and the low-concentration regions 949 can be formed by an ion implantation method. The description of the kinds of dopant used to form the high-concentration regions 908 can be referred to for the kinds of dopant used to form the high-concentration regions 948.

For example, in the case where nitrogen is used as the dopant, the concentration of nitrogen atoms in the high-concentration regions 948 is preferably higher than or equal to $5 \times 10^{19}/cm^3$ and lower than or equal to $1 \times 10^{22}/cm^3$, and the concentration of nitrogen atoms in the low-concentration regions 949 is preferably higher than or equal to $5 \times 10^{18}/cm^3$ and lower than $5 \times 10^{19}/cm^3$.

The high-concentration regions 948 to which the dopant imparting n-type conductivity is added have higher conductivity than the other regions in the oxide semiconductor layer 943. Therefore, by providing the high-concentration regions 948 in the oxide semiconductor layer 943, the resistance between the source electrode 944 and the drain electrode 945 can be decreased. The low-concentration regions 949 are provided between the channel formation region 951 and the high-concentration regions 948, so that a negative shift of the threshold voltage due to a short-channel effect can be reduced.

In the case where an In—Ga—Zn—O-based oxide semiconductor is used for the oxide semiconductor layer 943, heat treatment is performed at a temperature higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. Since the oxide semiconductor in the high-concentration regions 948 has a wurtzite crystal structure, the conductivity of the high-concentration regions 948 can be further increased and the resistance between the source electrode 944 and the drain electrode 945 can be decreased. Note that in order to effectively decrease the resistance between the source electrode 944 and the drain electrode 945 by forming an oxide semiconductor having a wurtzite crystal structure, in the case of using nitrogen as the dopant, the concentration of nitrogen atoms in the high-concentration regions 948 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above-mentioned range.

The oxide semiconductor layer 943 may be formed using a CAAC-OS film. When the oxide semiconductor layer 943 is formed using a CAAC-OS film, the conductivity of the oxide semiconductor layer 943 can be higher than that of an amorphous semiconductor film; therefore, the resistance between the source electrode 944 and the drain electrode 945 can be decreased.

The decrease in the resistance between the source electrode 944 and the drain electrode 945 ensures a high on-state current and high-speed operation even when the transistor 941 is miniaturized. Further, the miniaturization of the transistor 941 makes it possible to reduce the area occupied by an element including the transistor and increase the integration density of the semiconductor device.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, p. 504-507, 2010).

However, in the above manufacturing method, after a gate insulating layer is formed, the gate insulating layer needs to be partly removed so that a portion which is to be the source region and the drain region is exposed. Therefore, at the time of removing the gate insulating layer, the oxide semiconductor layer which is below the gate insulating layer is partly over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs significantly in the case where a dry etching method with which the selectivity of a gate insulating layer to an oxide semiconductor layer is not sufficient is employed.

For example, the overetching does not become a problem as long as the oxide semiconductor layer has an enough thickness; however, when the channel length is 200 nm or less, the thickness of the oxide semiconductor layer in a region which is to be a channel formation region needs to be 20 nm or less, preferably 10 nm or less so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as in one embodiment of the invention disclosed herein, addition of dopant to an oxide semiconductor layer is performed in the state where a gate insulating layer is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating layer is kept clean. Therefore, the characteristics and reliability of the transistor can be improved.

This embodiment can be implemented in appropriate combination with any of the other embodiments disclosed in this specification.

(Embodiment 4)

In this embodiment, a circuit configuration of a memory device, which is an example of a semiconductor device which can use the protection circuits described in Embodiment 1, and operation of the memory circuit will be described. The memory device in this embodiment includes both an element that uses silicon and an element that uses an oxide semiconductor. Therefore, a special step for forming the protection circuits is not necessary, and the protection circuits can be formed through the same process as other elements.

Figure 9A:
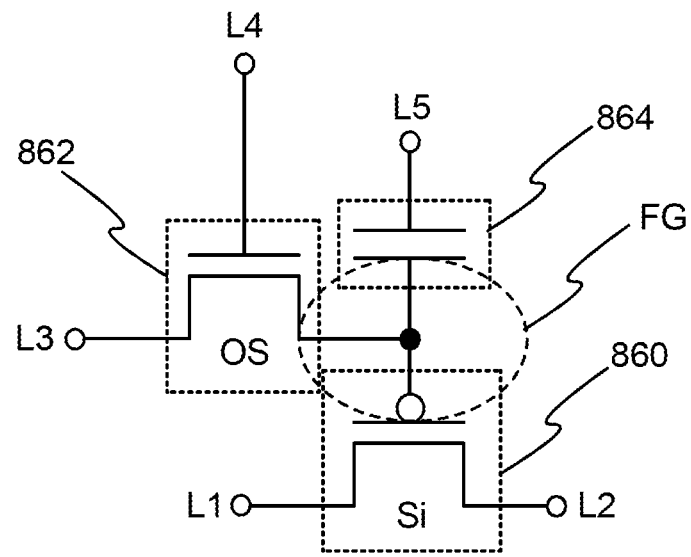
FIGS. 9A and 9B illustrate a memory cell.
Figure 9B:
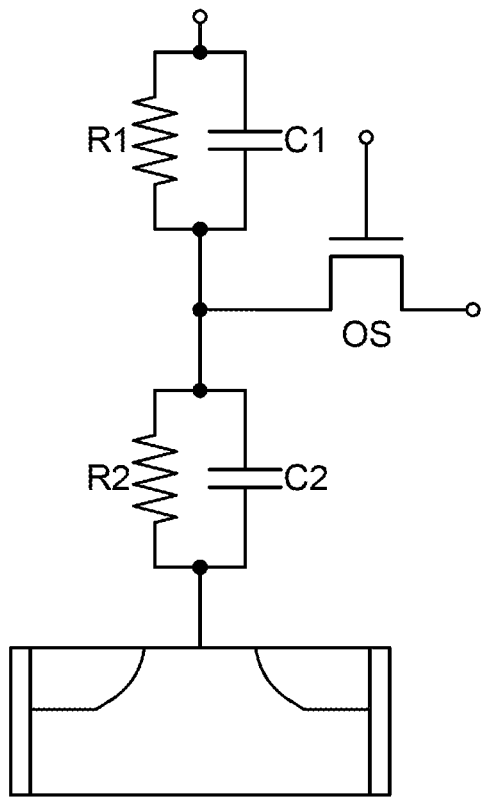

FIGS. 9A and 9B are circuit diagrams of a memory cell in a memory device. Here, a first transistor 860 is a p-channel transistor formed using silicon, and a second transistor 862 is an n-channel transistor formed using an oxide semiconductor.

In the memory cell illustrated in FIG. 9A, a first wiring (L1) and one of a source electrode and a drain electrode of the first transistor 860 are electrically connected to each other, and a second wiring (L2) and the other of the source electrode and the drain electrode of the first transistor 860 are electrically connected to each other. Further, a third wiring (L3) and one of a source electrode and a drain electrode of the second transistor 862 are electrically connected to each other, and a fourth wiring (L4) and a gate electrode of the second transistor 862 are electrically connected to each other. Furthermore, a gate electrode of the first transistor 860 and the other of the source electrode and the drain electrode of the second transistor 862 are electrically connected to one electrode of a capacitor 864. A fifth wiring (L5) is electrically connected to the other electrode of the capacitor 864.

The memory cell illustrated in FIG. 9A utilizes a characteristic in which the potential of the gate electrode of the first transistor 860 can be held, whereby writing, holding, and reading of data can be performed as follows.

First of all, writing and holding of data will be described. First, the potential of the fourth wiring is set to a potential at which the second transistor 862 is on, so that the second transistor 862 is turned on. Accordingly, the potential of the third wiring is supplied to the gate electrode of the first transistor 860 and the capacitor 864. That is, predetermined charge is supplied to the gate electrode of the first transistor 860. Here, one of two kinds of charges providing different potentials (hereinafter, a charge providing a low potential is referred to as charge $Q_L$ and a charge providing a high potential is referred to as charge $Q_H$) is applied. Note that three or more kinds of charges providing different potentials may be applied to improve storage capacity. After that, the potential of the fourth wiring is set to a potential at which the second transistor 862 is off, so that the second transistor 862 is turned off. Thus, the charge supplied to the gate electrode of the first transistor 860 is held.

Since the off-state current of the second transistor 862 including an oxide semiconductor is significantly small, the charge in the gate electrode of the first transistor 860 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held in the gate electrode of the first transistor 860. This is because in general, when the first transistor 860 is a p-channel transistor, an apparent threshold voltage $V_{th\_H}$ in the case where $Q_H$ is given to the gate electrode of the first transistor 860 is lower than an apparent threshold voltage $V_{th\_L}$ in the case where $Q_L$ is given to the gate electrode of the first transistor 860. Here, an apparent threshold voltage refers to the potential of the fifth wiring, which is needed to turn on the first transistor 860. Thus, the potential of the fifth wiring is set to a potential $V_0$ that is between $V_{th\_H}$ and $V_{th\_L}$, whereby charge supplied to the gate electrode of the first transistor 860 can be determined. For example, in the case where $Q_H$ is supplied in writing, when the potential of the fifth wiring is $V_0$ ($>V_{th\_H}$), the first transistor 860 remains in an off state. In the case where $Q_L$ is supplied in writing, when the potential of the fifth wiring is $V_0$ ($<V_{th\_L}$), the first transistor 860 is turned on. Therefore, the data held can be read by measuring the potential of the second wiring.

Note that in the case where memory cells are arrayed, it is necessary that data of only a desired memory cell can be read. In the case where data of the predetermined memory cell is read out and data of the other memory cells is not read out, a potential at which the first transistor 860 is in an off state regardless of the state of the gate electrode, that is, a potential higher than $V_{th\_L}$, may be applied to the fifth wirings of the memory cells whose data is not to be read. Alternatively, a potential at which the first transistor 860 is in an on state regardless of the state of the gate electrode, that is, a potential lower than $V_{th\_H}$, may be applied to the fifth wirings.

Next, rewriting of data will be described. Rewriting of data is performed in a manner similar to that of the above writing and holding of data. That is, the potential of the fourth wiring is set to a potential at which the second transistor 862 is on, so that the second transistor 862 is turned on. Accordingly, the potential of the third wiring (a potential for new data) is supplied to the gate electrode of the first transistor 860 and the capacitor 864. After that, the potential of the fourth wiring is set to a potential at which the second transistor 862 is off, so that the second transistor 862 is turned off. Accordingly, the gate electrode of the first transistor 860 is supplied with charge for new data.

In the memory device according to an embodiment of the invention disclosed herein, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the memory device can be realized.

Note that the other of the source electrode and the drain electrode of the second transistor 862 is electrically connected to the gate electrode of the first transistor 860 and therefore has a function similar to that of a floating gate of a floating gate transistor used as a nonvolatile memory element. A portion where one of the source electrode and the drain electrode of the second transistor 862 and the gate electrode of the first transistor 860 are electrically connected to each other is called a node FG in some cases. When the second transistor 862 is off, the node FG can be regarded as being embedded in an insulator and thus charge is held at the node FG The off-state current of the second transistor 862 including an oxide semiconductor is smaller than or equal to 1/100000 of the off-state current of a transistor including a silicon semiconductor; thus, loss of the charge accumulated in the node FG due to leakage in the second transistor 862 is negligible. That is, with the second transistor 862 including an oxide semiconductor, a nonvolatile memory device which can hold data without being supplied with power can be realized.

For example, when the off-state current of the second transistor 862 at room temperature (25° C.) is 10 zA (1 zA (zeptoampere) is $1 \times 10^{-21}$ A) or less and the capacitance of the capacitor 864 is approximately 10 fF, data can be held for $10^4$ seconds or longer. It is needless to say that the holding time depends on transistor characteristics and capacitance.

Further, the memory cell illustrated in FIG. 9A does not have the problem of deterioration of a gate insulating layer (a tunnel insulating layer), which is a problem of a conventional floating gate transistor. That is, the problem of deterioration of a gate insulating layer due to injection of electrons into a floating gate, which is a conventional problem, can be solved. This means that there is no limit on the number of write cycles in principle. Furthermore, a high voltage needed for writing or erasing in a conventional floating gate transistor is not necessary.

Components such as transistors in the memory cell in FIG. 9A can be regarded as including resistors and capacitors as illustrated in FIG. 9B. That is, in FIG. 9A, the first transistor 860 and the capacitor 864 are each regarded as including a resistor and a capacitor. R1 and C1 denote the resistance and the capacitance of the capacitor 864, respectively. The resistance R1 corresponds to the resistance of the insulating layer included in the capacitor 864. R2 and C2 denote the resistance and the capacitance of the first transistor 860, respectively. The resistance R2 corresponds to the resistance of the gate insulating layer at the time when the first transistor 860 is on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the second transistor 862 under the conditions where the gate leak current of the second transistor 862 is sufficiently small and R1 and R2 satisfy R1≥ROS(R1 is greater than or equal to ROS) and R2≥ROS (R2 is greater than or equal to ROS), where ROS is the resistance (also referred to as effective resistance) between the source electrode and the drain electrode in a state where the second transistor 862 is off.

On the other hand, in the case where the above conditions are not satisfied, it is difficult to secure a sufficient holding period even if the off-state current of the second transistor 862 is sufficiently small. This is because a leak current other than the off-state current of the second transistor 862 (e.g., a leak current generated between the source electrode and the gate electrode of the first transistor 860) is large. Accordingly, it can be said that it is preferable that the memory cell disclosed in this embodiment satisfies the relations of R1≥ROS(R1 is greater than or equal to ROS) and R2≥ROS (R2 is greater than or equal to ROS).

Meanwhile, it is desirable that C1 and C2 satisfy C1≥C2 (C1 is greater than or equal to C2). This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relations are satisfied, a more favorable memory cell can be realized. Note that R1 and R2 depend on the gate insulating layer of the first transistor 860 and the insulating layer of the capacitor 864. The same applies to C1 and C2. Therefore, the material, the thickness, and the like of the gate insulating layer are preferably set as appropriate to satisfy the above relations.

In the memory cell described in this embodiment, the node FG has a function similar to that of a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the memory device. The factor is attributed to a basic principle of a flash memory, in which a tunneling current is generated by application of a high electric field.

On the other hand, the memory cell according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates an increase in the degree of integration.

Accordingly, the memory device according to this embodiment is advantageous over a flash memory also in that a large step-up circuit or the like is not necessary. For example, the highest voltage applied to the memory cell (the difference between the highest potential and the lowest potential applied to respective electrodes of the memory cell at the same time) can be 5 V or less, preferably 3 V or less, in one memory cell in the case where data of two stages (one bit) is written.

In the case where the relative permittivity $\in$r1 of the insulating layer included in the capacitor 864 is different from the relative permittivity $\in$r2 of the insulating layer included in the first transistor 860, it is easy to satisfy C1≥C2 (C1 is greater than or equal to C2) while satisfying 2·S2≥S1 (2·S2 is greater than or equal to S1), preferably S2≥S1 (S2 is greater than or equal to S1), where S1 is the area of the insulating layer included in the capacitor 864 and S2 is the area of the insulating layer forming a gate capacitor of the first transistor 860. In other words, C1 can easily be made greater than or equal to C2 while the area of the insulating layer included in the capacitor 864 is made small. Specifically, for example, a layer including a high-k material such as hafnium oxide or a stack of a layer including a high-k material such as hafnium oxide and a layer including an oxide semiconductor is used for the insulating layer included in the capacitor 864 so that $\in$r1 can be set to 10 or more, preferably 15 or more, and silicon oxide or the like is used for the insulating layer forming the gate capacitor so that $\in$r2 can be set to 3 to 4.

A combination of such structures enables the memory device to have further higher integration.

Note that in addition to the increase in the degree of integration, a multilevel technique can be employed to increase the storage capacity of the memory device. For example, three or more levels of data are written to one memory cell, whereby the storage capacity can be increased as compared to the case where two-level (one-bit) data is written. The multilevel technique can be achieved by, for example, supplying charge Q providing a potential to the gate electrode of the first transistor, in addition to charge $Q_L$ providing a low potential and charge $Q_H$ providing a high potential as described above.

As described above, with a circuit configuration including a transistor that uses silicon and a transistor that uses an oxide semiconductor, a memory device having excellent retention characteristics can be formed. Further, the memory device can be provided with the protection circuits described in Embodiment 1 without the need for a special step.

This embodiment can be implemented in appropriate combination with any of the other embodiments disclosed in this specification.

(Embodiment 5)

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$ respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[FORMULA 3]}$$

Here, e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \qquad \text{[FORMULA 5]}$$
$$\ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph which is obtained by plotting actual measured values with $\ln(h/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 $cm^2/Vs$ from Formula 2 and Formula 3. The measured mobility of an In—Sn—Zn oxide including a defect is approximately 35 $cm^2/Vs$. However, assuming that no defect exists inside the semiconductor and at the interface between the semiconductor and an insulating film, the mobility $\mu_0$ of the oxide semiconductor is expected to be 120 $cm^2/Vs$.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \qquad \text{[FORMULA 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 15:
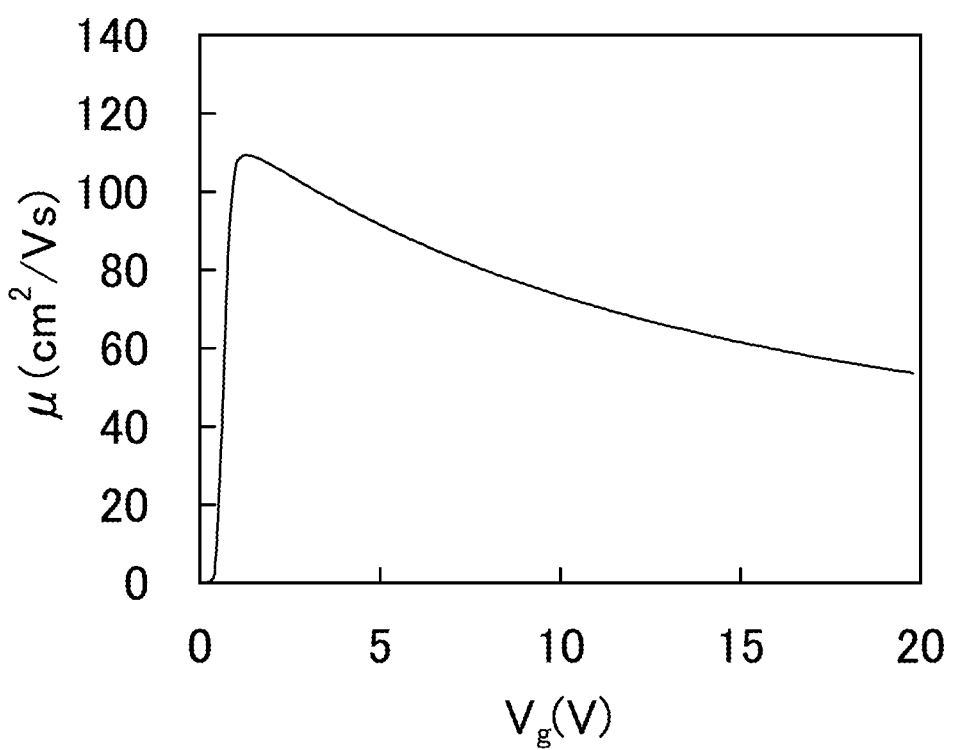
FIG. 15 shows the gate voltage dependence of mobility obtained by calculation.

Calculation results of the mobility $\mu_2$ of a transistor whose channel includes an ideal oxide semiconductor without a defect inside the semiconductor are shown in FIG. 15. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 15, the mobility has a peak of more than 100 $cm^2/Vs$ at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 16A to 16C, FIGS. 17A to 17C, and FIGS. 18A to 18C. FIGS. 19A and 19B illustrate cross-sectional structures of the transistors used for the calculation. The transistors illustrated in FIGS. 19A and 19B each include a semiconductor region 2103a and a semiconductor region 2103c which have $n^+$-type conductivity in an oxide semiconductor layer. The resistivities of the semiconductor region 2103a and the semiconductor region 2103c are $2 \times 10^{-3}$ Ω·cm.

The transistor illustrated in FIG. 19A is formed over a base insulating layer 2101 and an embedded insulator 2102 which is embedded in the base insulating layer 2101 and formed of aluminum oxide. The transistor includes the semiconductor region 2103a, the semiconductor region 2103c, an intrinsic semiconductor region 2103b serving as a channel formation region therebetween, and a gate 2105. The width of the gate 2105 is 33 nm.

A gate insulating layer 2104 is formed between the gate 2105 and the semiconductor region 2103b. In addition, a sidewall insulator 2106a and a sidewall insulator 2106b are formed on both side surfaces of the gate 2105, and an insulator 2107 is formed over the gate 2105 so as to prevent a short circuit between the gate 2105 and another wiring. The sidewall insulating layer has a width of 5 nm. A source 2108a and a drain 2108b are provided in contact with the semiconductor region 2103a and the semiconductor region 2103c, respectively. Note that the channel width of this transistor is 40 nm.

The transistor of FIG. 19B is the same as the transistor of FIG. 19A in that it is formed over the base insulating layer 2101 and the embedded insulator 2102 formed of aluminum oxide and that it includes the semiconductor region 2103a, the semiconductor region 2103c, the intrinsic semiconductor region 2103b provided therebetween, the gate 2105 having a width of 33 nm, the gate insulating layer 2104, the sidewall insulator 2106a, the sidewall insulator 2106b, the insulator 2107, the source 2108a, and the drain 2108b.

The transistor illustrated in FIG. 19A is different from the transistor illustrated in FIG. 19B in the conductivity type of semiconductor regions under the sidewall insulator 2106a and the sidewall insulator 2106b. In the transistor illustrated in FIG. 19A, the semiconductor regions under the sidewall insulator 2106a and the sidewall insulator 2106b are part of the semiconductor region 2103a having $n^+$-type conductivity and part of the semiconductor region 2103c having $n^+$-type conductivity, whereas in the transistor illustrated in FIG. 19B, the semiconductor regions under the sidewall insulator 2106a and the sidewall insulator 2106b are part of the intrinsic semiconductor region 2103b. In other words, in the semiconductor layer of FIG. 19B, a region having a width of $L_{off}$ which overlaps with neither the semiconductor region 2103a (the semiconductor region 2103c) nor the gate 2105 is provided. This region is called an offset region, and the width $L_{off}$ is called an offset length. As is seen from the drawing, the offset length is equal to the width of the sidewall insulator 2106a (the sidewall insulator 2106b).

Figure 16A:
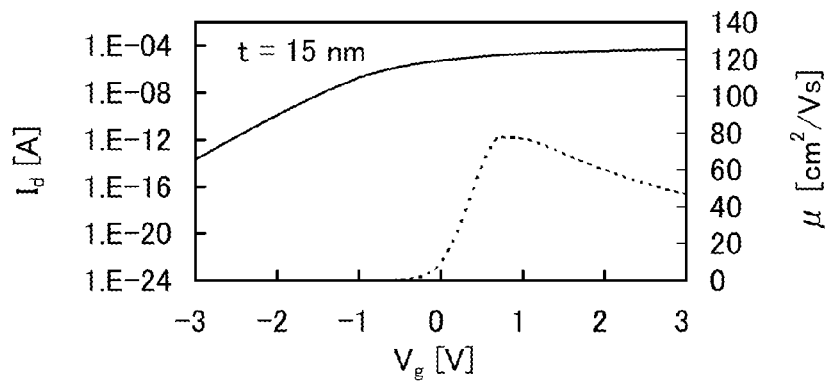
FIGS. 16A to 16C show the gate voltage dependence of drain current and mobility obtained by calculation.
Figure 16B:
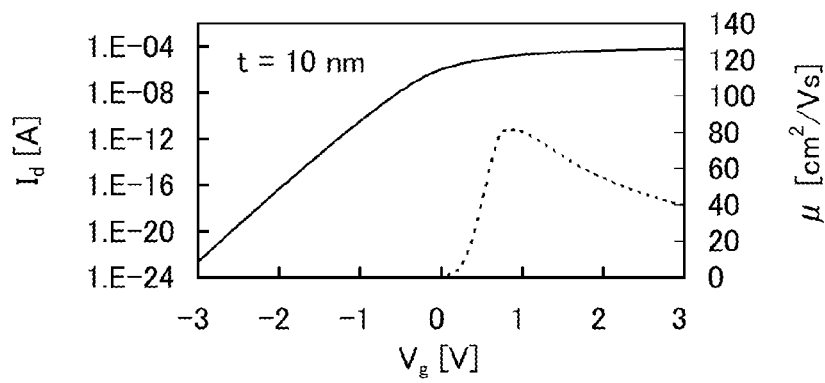
Figure 16C:
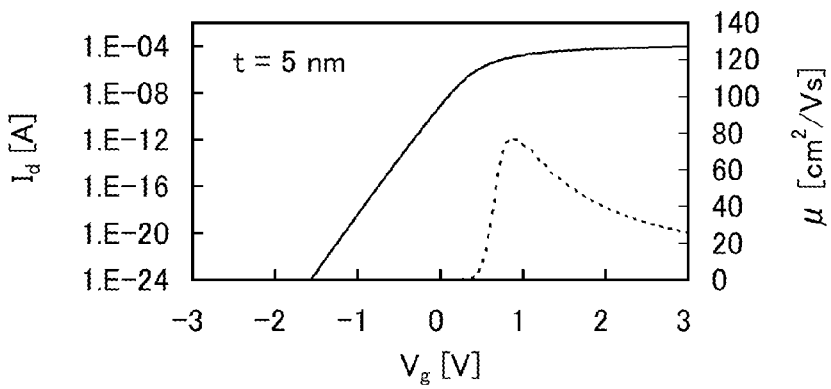

The other parameters used in calculation are as described above. For the calculation, device simulation software Sentaurus Device manufactured by Synopsys, Inc. was used. FIGS. 16A to 16C show the gate voltage ($V_g$: a potential difference between the gate and the source) dependence of the drain current ($I_d$, a solid line) and the mobility ($\mu$, a dotted line) of the transistor having the structure illustrated in FIG. 19A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 16A shows the gate voltage dependence of the transistor in the case where the thickness of the gate insulating layer is 15 nm, FIG. 16B shows that of the transistor in the case where the thickness of the gate insulating layer is 10 nm, and FIG. 16C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility $\mu$ and the drain current $I_d$ in an on state (on-state current). The graphs show that the drain current exceeds 10 µA, which is required in a memory element and the like, at a gate voltage of around 1 V.

Figure 17A:
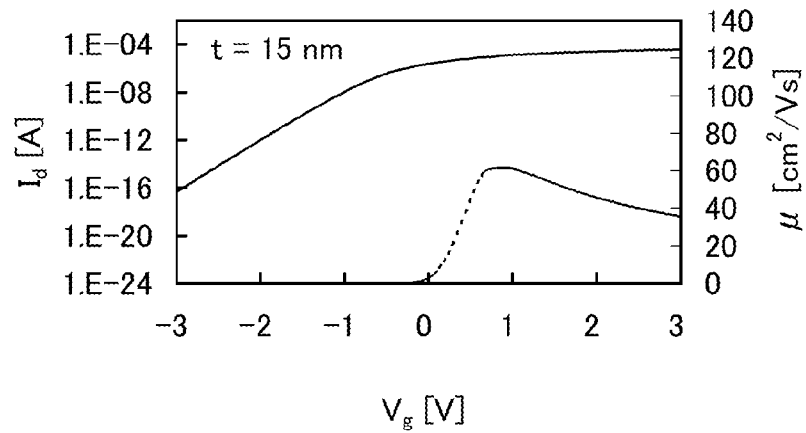
FIGS. 17A to 17C show the gate voltage dependence of drain current and mobility obtained by calculation.
Figure 17B:
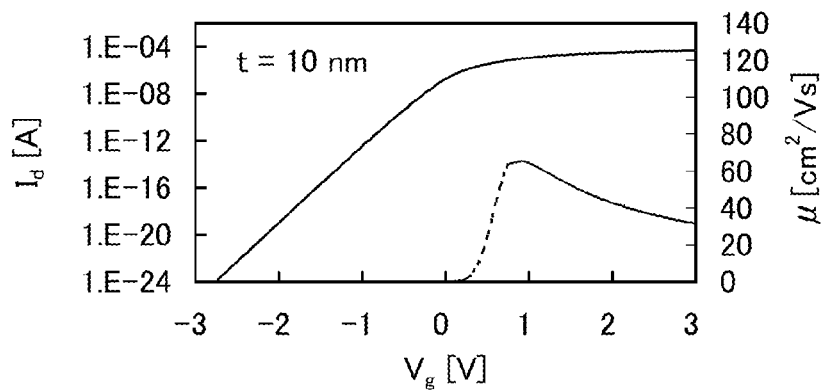
Figure 17C:
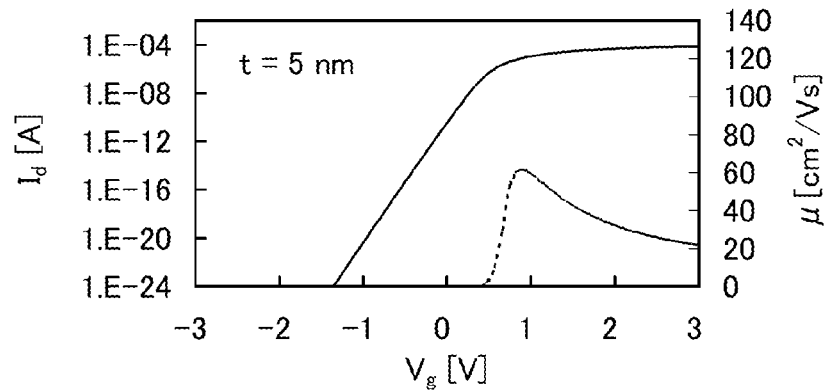

FIGS. 17A to 17C show the gate voltage $V_g$ dependence of the drain current $I_d$ (a solid line) and the mobility $\mu$ (a dotted line) of the transistor having the structure illustrated in FIG. 19B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 17A shows the gate voltage dependence of the transistor in the case where the thickness of the gate insulating layer is 15 nm, FIG. 17B shows that of the transistor in the case where the thickness of the gate insulating layer is 10 nm, and FIG. 17C shows that of the transistor in the case where the thickness of the gate insulating layer is 5 nm.

Figure 18A:
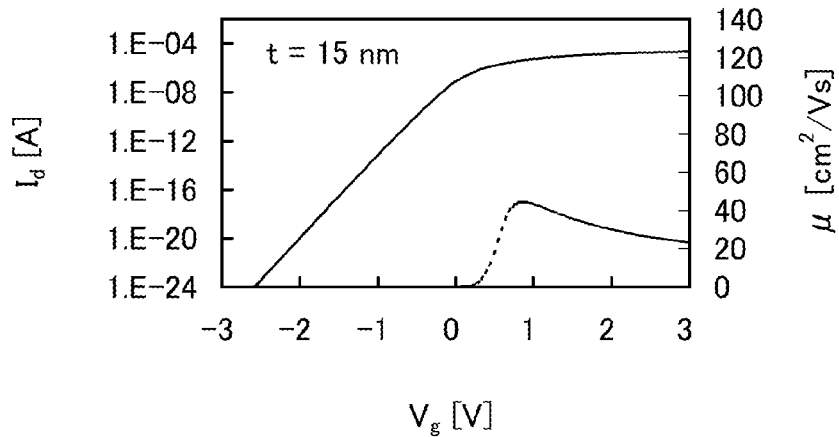
FIGS. 18A to 18C show the gate voltage dependence of drain current and mobility obtained by calculation.
Figure 18B:
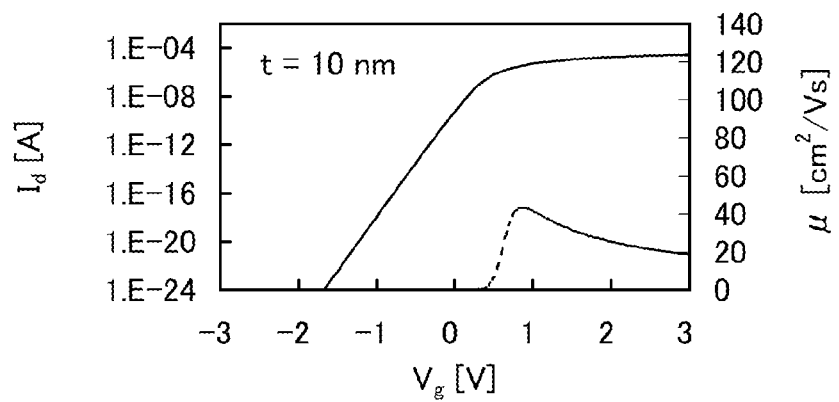
Figure 18C:
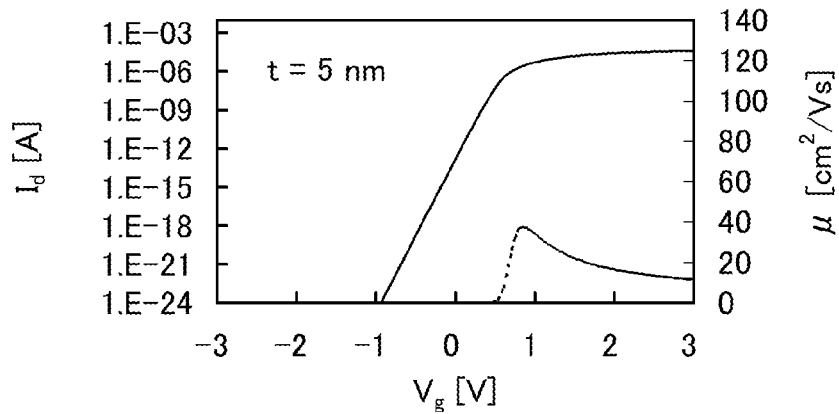
Figure 19A:
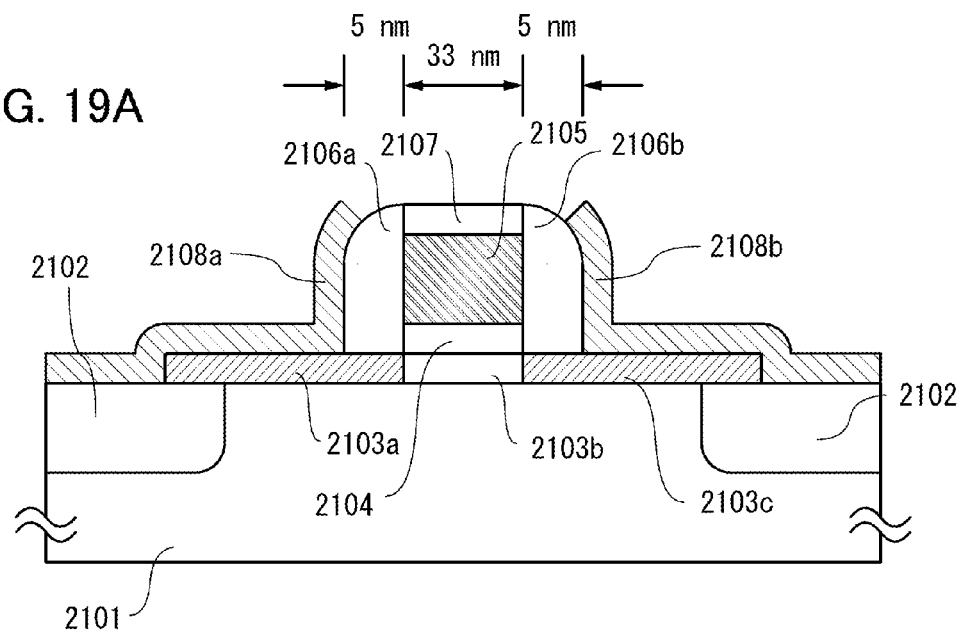
FIGS. 19A and 19B illustrate cross-sectional structures of transistors which are used in calculation.
Figure 19B:
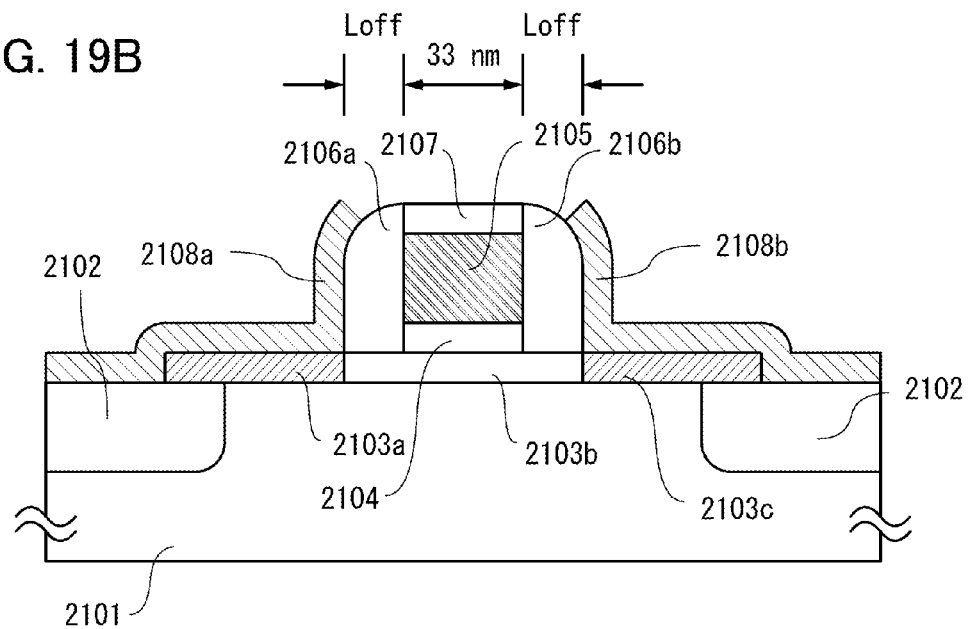

Further, FIGS. 18A to 18C show the gate voltage dependence of the drain current $I_d$ (a solid line) and the mobility $\mu$ (a dotted line) of the transistor having the structure illustrated in FIG. 19B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 18A shows the gate voltage dependence of the transistor in the case where the thickness of the gate insulating layer is 15 nm, FIG. 18B shows that of the transistor in the case where the thickness of the gate insulating layer is 10 nm, and FIG. 18C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm²/Vs in FIGS. 16A to 16C, approximately 60 cm²/Vs in FIGS. 17A to 17C, and approximately 40 cm²/Vs in FIGS. 18A to 18C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA, which is required in a memory element and the like, at a gate voltage of around 1 V.

(Embodiment 6)

In this embodiment, the case where the semiconductor device described in the above embodiment is applied to an electronic device will be described with reference to FIGS. 10A to 10F. In this embodiment, examples of the electronic device to which a semiconductor device according to an embodiment of the present invention is applied include a computer, a mobile phone, a personal digital assistant (including a portable game machine, an audio reproducing device, and the like), a camera such as a digital camera or a digital video camera, electronic paper, and a television device.

Figure 10A:
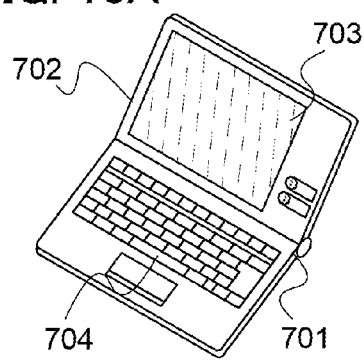
FIGS. 10A to 10F illustrate electronic devices.

FIG. 10A illustrates a laptop personal computer that includes a housing 701, a housing 702, a display portion 703, a keyboard 704, and the like. The semiconductor device described in any of the above embodiments is provided in at least one of the housing 701 and the housing 702. Therefore, a laptop personal computer with reduced size and high reliability can be achieved.

Figure 10D:
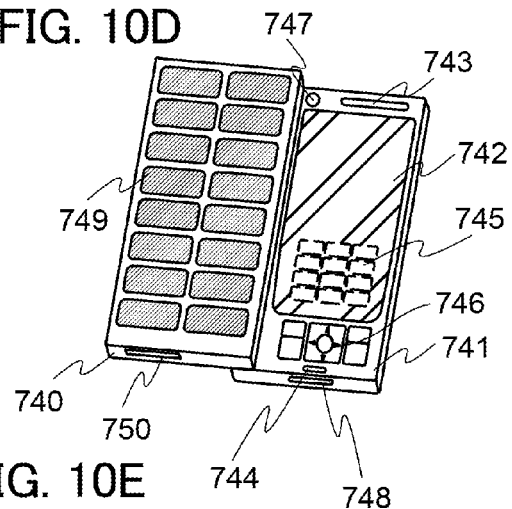
Figure 10B:
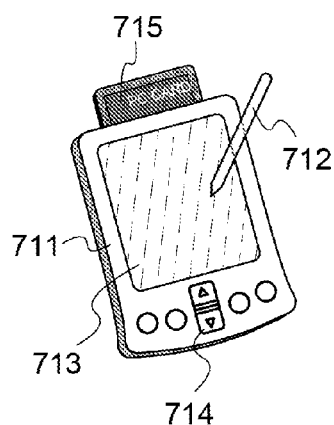

FIG. 10B illustrates a personal digital assistant (PDA). A main body 711 is provided with a display portion 713, an external interface 715, operation buttons 714, and the like. The personal digital assistant can be operated with the use of a stylus 712 or the like. In the main body 711, the semiconductor device described in any of the above embodiments is provided. Therefore, a personal digital assistant with reduced size and high reliability can be achieved.

Figure 10E:
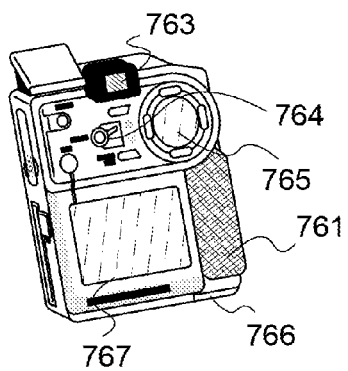
Figure 10C:
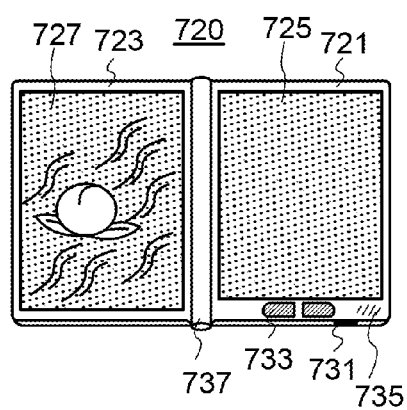

FIG. 10C illustrates an e-book reader 720 on which electronic paper is mounted. The e-book reader 720 has two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Therefore, an e-book reader with reduced size and high reliability can be achieved.

FIG. 10D illustrates a mobile phone which includes two housings, a housing 740 and a housing 741. Further, the housing 740 and the housing 741 in a state where they are developed as illustrated in FIG. 10D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera 747, an external connection electrode 748, and the like. The housing 740 includes a solar cell 749 for charging the mobile phone, an external memory slot 750, and the like. In addition, an antenna is incorporated in the housing 741. At least one of the housings 740 and 741 is provided with the semiconductor device described in any of the above embodiments. Therefore, a mobile phone with reduced size and high reliability can be achieved.

FIG. 10E illustrates a digital camera including a main body 761, a display portion 767, an eyepiece 763, an operation switch 764, a display portion 765, a battery 766, and the like. In the main body 761, the semiconductor device described in any of the above embodiments is provided. Therefore, a digital camera with reduced size and high reliability can be achieved.

Figure 10F:
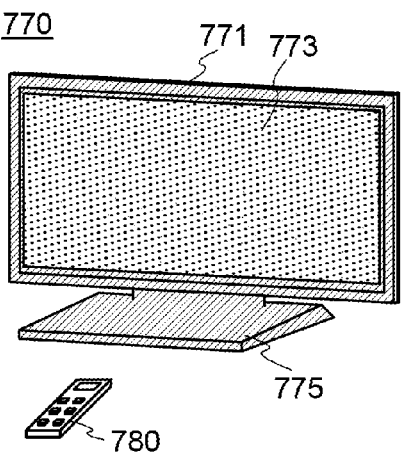

FIG. 10F illustrates a television device including a housing 771, a display portion 773, a stand 775, and the like. The television device 770 can be operated with an operation switch of the housing 771 or a remote controller 780. The semiconductor device described in any of the above embodiments is mounted on the housing 771 and the remote controller 780. Therefore, a television device with reduced size and high reliability can be achieved.

As described above, the electronic devices described in this embodiment each include the semiconductor device according to the above embodiment. Therefore, electronic devices with reduced size and high reliability can be achieved.

This embodiment can be implemented in appropriate combination with any of the other embodiments disclosed in this specification.

EXAMPLE 1

A transistor in which an oxide semiconductor including In, Sn, and Zn as main components is used as a channel formation region can have favorable characteristics by depositing the oxide semiconductor while heating a substrate or by performing heat treatment after an oxide semiconductor layer is formed. Note that a main component refers to an element included in a composition at 5 atomic % or more.

By intentionally heating the substrate after formation of the oxide semiconductor layer including In, Sn, and Zn as main components, the field-effect mobility of the transistor can be improved. Further, the threshold voltage of the transistor can be positively shifted to make the transistor normally off.

Figure 20A:
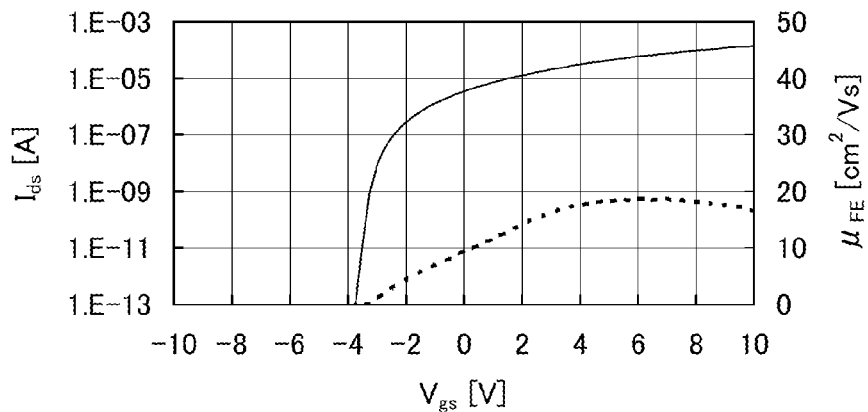
FIGS. 20A to 20C are graphs each showing characteristics of a transistor including an oxide semiconductor layer.
Figure 20B:
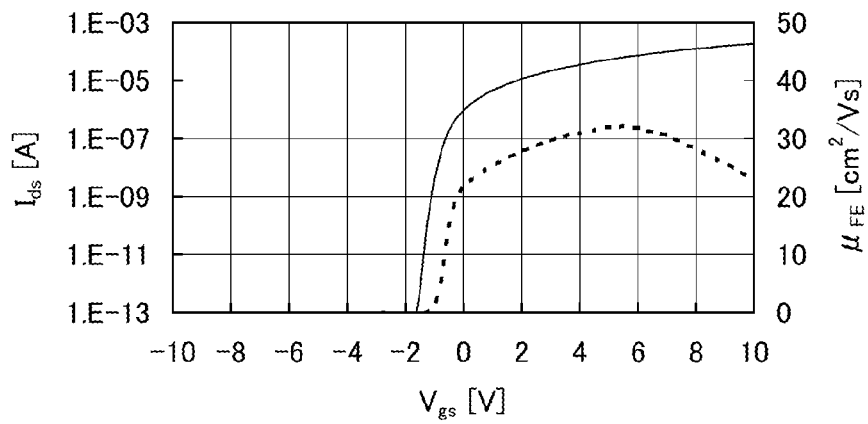
Figure 20C:
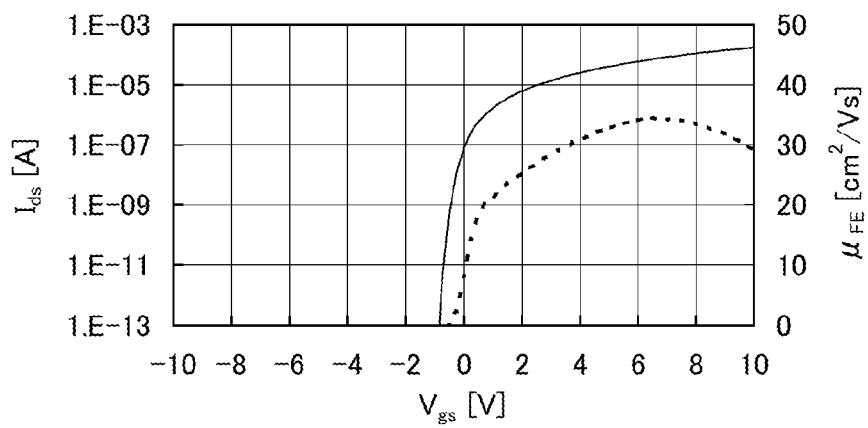

As an example, FIGS. 20A to 20C each show characteristics of a transistor in which an oxide semiconductor layer including In, Sn, and Zn as main components and having a channel length L of 3 μm and a channel width W of 10 μm, and a gate insulating layer with a thickness of 100 nm are used. Note that $V_d$ was set to 10 V.

FIG. 20A shows characteristics of a transistor whose oxide semiconductor layer including In, Sn, and Zn as main components was formed by a sputtering method without heating a substrate intentionally. The field-effect mobility of the transistor is 18.8 $cm^2$/Vsec. On the other hand, when the oxide semiconductor layer including In, Sn, and Zn as main components is formed while heating the substrate intentionally, the field-effect mobility can be improved. FIG. 20B shows characteristics of a transistor whose oxide semiconductor layer including In, Sn, and Zn as main components was formed while heating a substrate at 200° C. The field-effect mobility of the transistor is 32.2 $cm^2$/Vsec.

The field-effect mobility can be further improved by performing heat treatment after formation of the oxide semiconductor layer including In, Sn, and Zn as main components. FIG. 20C shows characteristics of a transistor whose oxide semiconductor layer including In, Sn, and Zn as main components was formed at 200° C. and then subjected to heat treatment at 650° C. The field-effect mobility of the transistor is 34.5 $cm^2$/Vsec.

By the intentional heating of the substrate, moisture taken into the oxide semiconductor layer during film formation can be reduced. Further, the heat treatment after film formation enables hydrogen, a hydroxyl group, or moisture to be released and removed from the oxide semiconductor layer. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 $cm^2$/Vsec is expected to be realized.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor layer that includes In, Sn, and Zn as main components and is formed without heating a substrate intentionally is used as a channel formation region, the threshold voltage tends to be shifted negatively. However, when the oxide semiconductor layer formed while heating the substrate intentionally is used, the problem of the negative shift of the threshold voltage can be solved. That is, the threshold voltage is shifted so that the transistor becomes normally off; this tendency can be confirmed by comparison between FIGS. 20A and 20B.

Note that the threshold voltage can also be controlled by changing the ratio of In, Sn, and Zn; when the composition ratio of In, Sn, and Zn is 2:1:3, a normally-off transistor can be formed. In addition, an oxide semiconductor layer having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor layer, and Sample 2 on which heat treatment at 650° C. was performed after formation of an oxide semiconductor layer.

First, $V_g$-$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 21A:
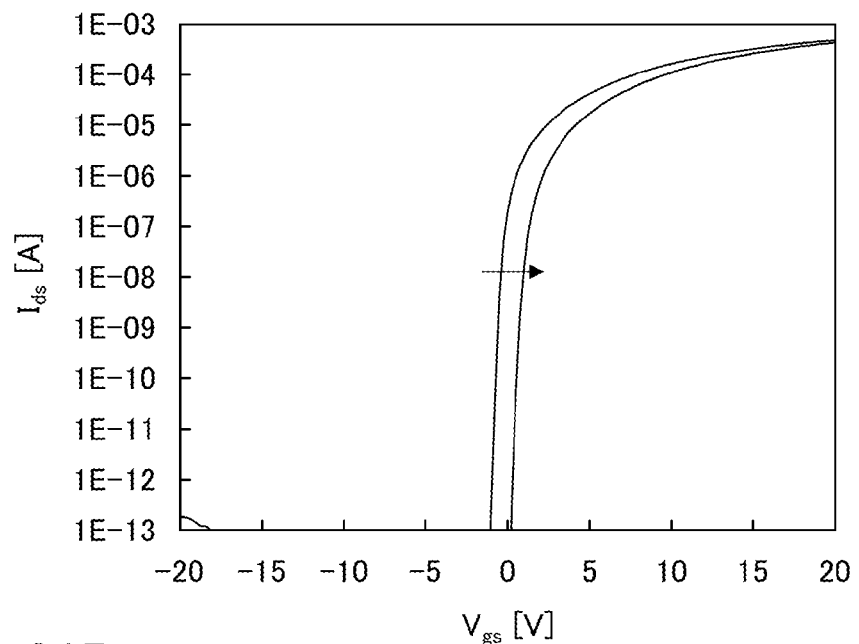
FIGS. 21A and 21B are graphs each showing $V_g$-$I_d$ characteristics after a BT test of a transistor that is Sample 1.
Figure 21B:
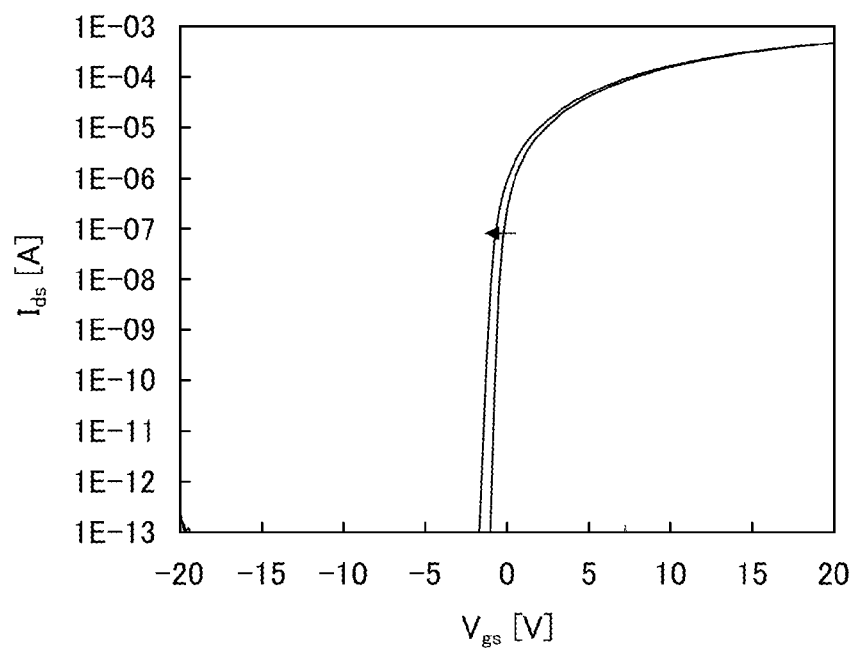
Figure 22A:
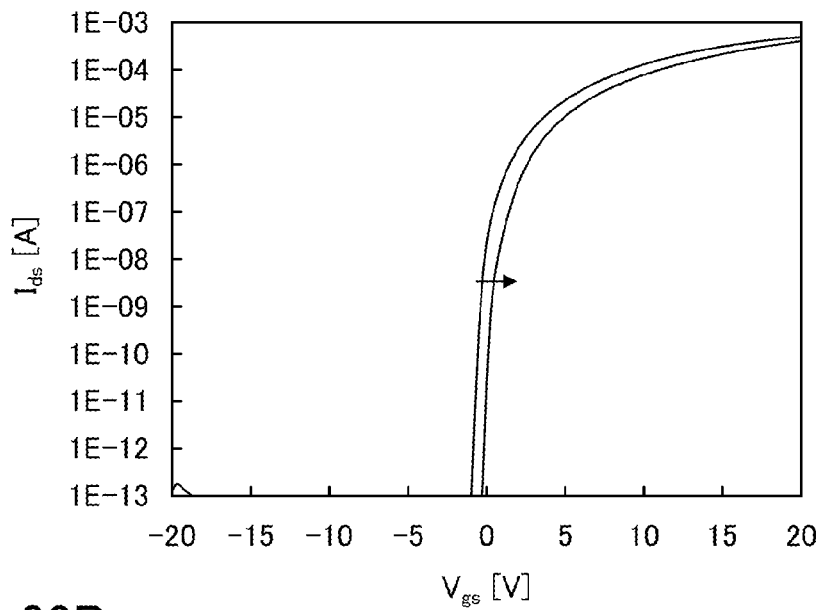
FIGS. 22A and 22B are graphs each showing $V_g$-$I_d$ characteristics after a BT test of a transistor that is Sample 2.
Figure 22B:
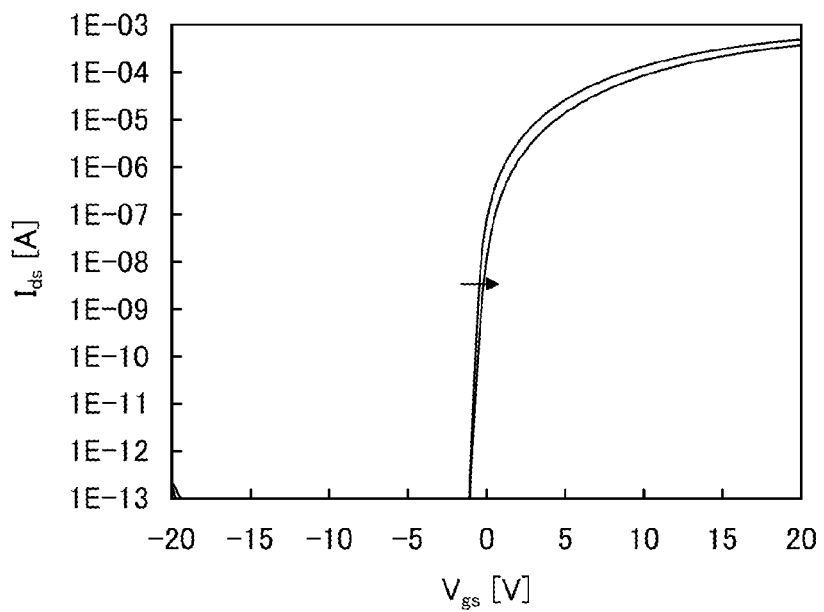

FIGS. 21A and 21B show a result of the positive BT test of Sample 1 and a result of the negative BT test of Sample 1, respectively. FIGS. 22A and 22B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor layer may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor layer can be obtained. For example, when an oxide semiconductor layer which is formed by sputtering using a target having a composition ratio of In:Sn:Zn=1:1:1 without heating a substrate intentionally is analyzed by X-ray diffraction (XRD), a halo pattern is observed. The formed oxide semiconductor layer can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 23:
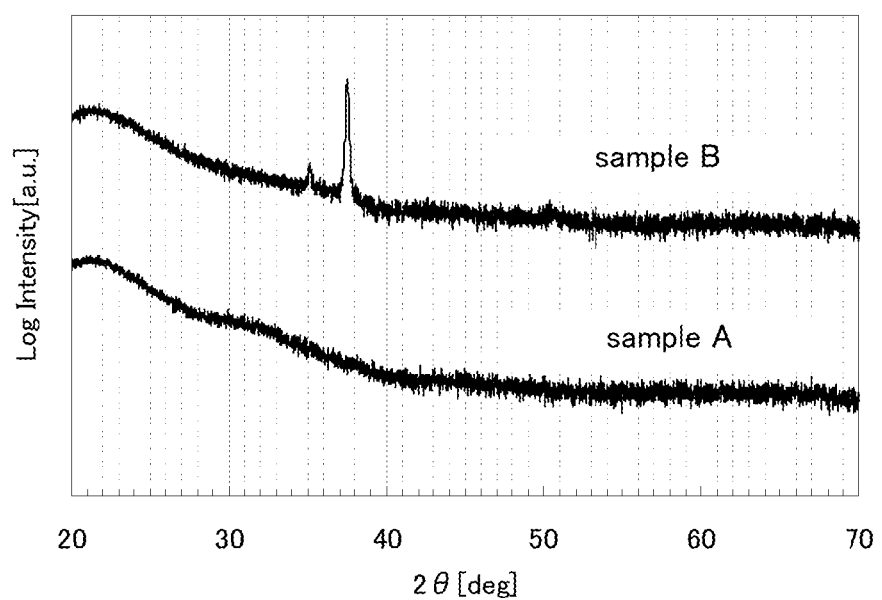
FIG. 23 shows XRD spectra of Sample A and Sample B.

FIG. 23 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 24:
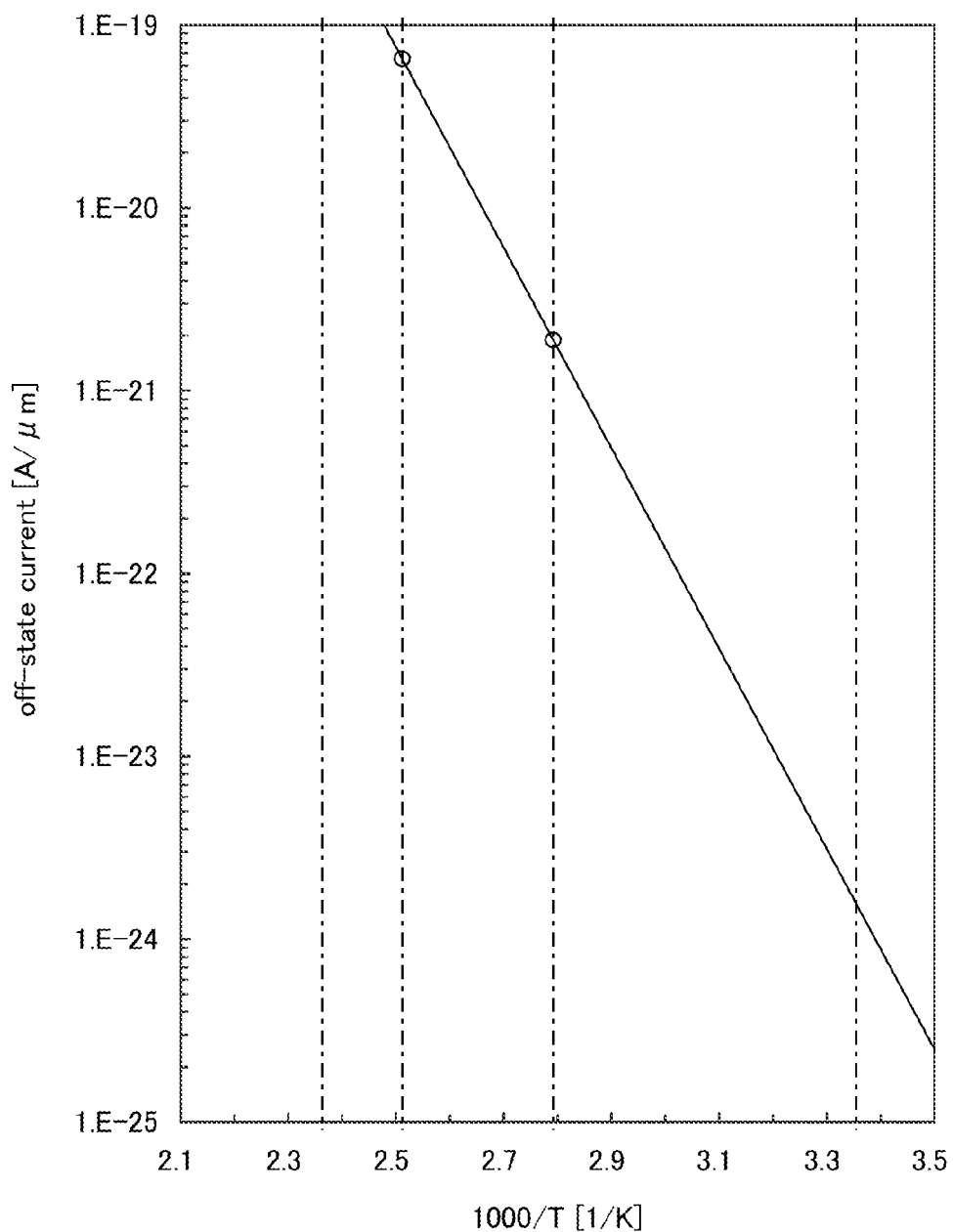
FIG. 24 is a graph showing a relation between the off-state current of a transistor and the substrate temperature in measurement.

FIG. 24 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 24, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor layer during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor layer, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor layer, is referred to as dW.

Figure 25:
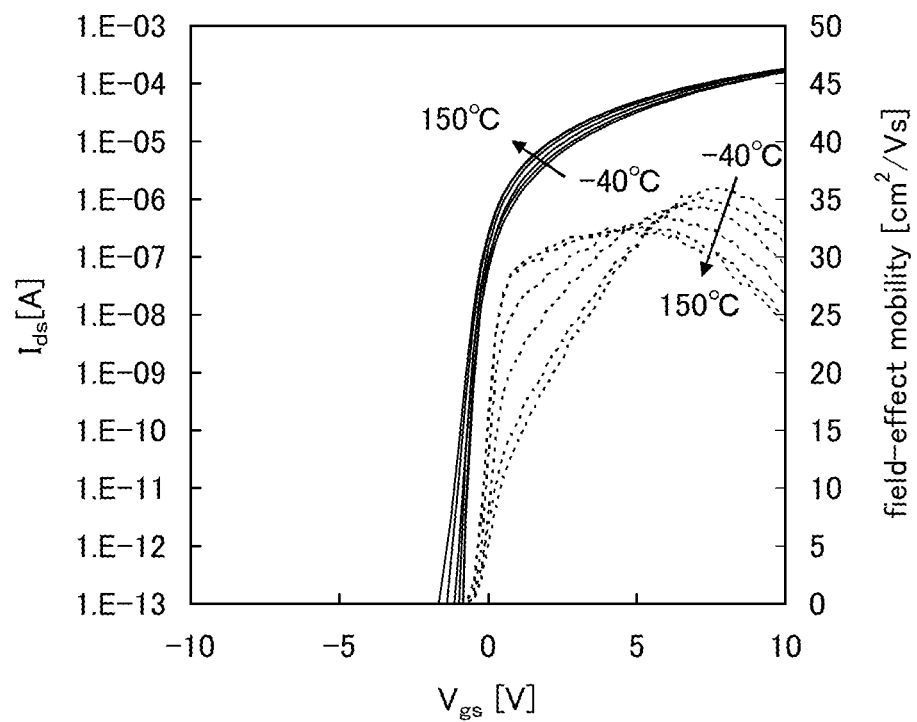
FIG. 25 is a graph showing $V_g$ dependence of $I_d$ and the field-effect mobility.
Figure 26A:
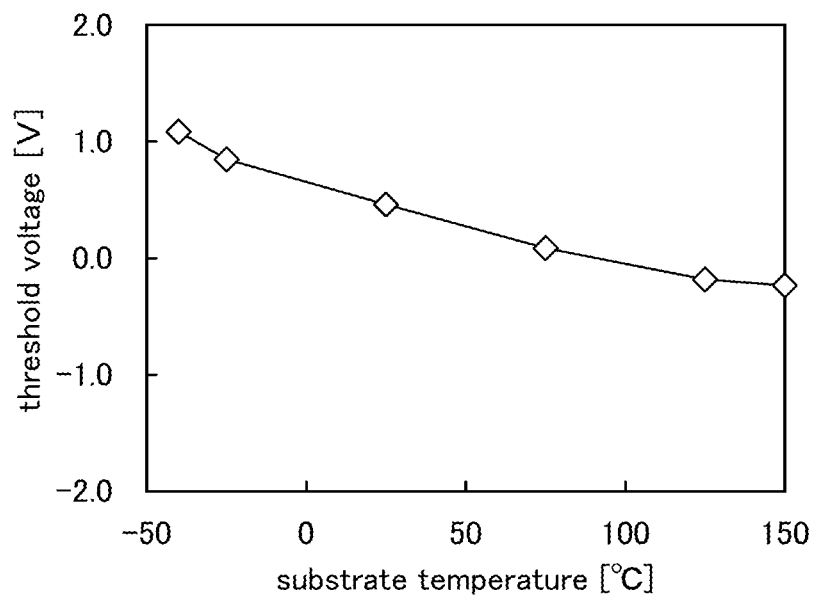
FIGS. 26A and 26B are graphs showing a relation between a substrate temperature and a threshold voltage and a relation between a substrate temperature and a field-effect mobility, respectively.

FIG. 25 shows the $V_g$ dependence of $I_d$ (a solid line) and field-effect mobility (a dotted line). FIG. 26A shows a relation between the substrate temperature and the threshold voltage, and FIG. 26B shows a relation between the substrate temperature and the field-effect mobility.

From FIG. 26A, it is found that the threshold voltage gets lower as the substrate temperature increases. Note that the threshold voltage is decreased from 1.09 V to −0.23 V in the range from −40° C. to 150° C.

Figure 26B:
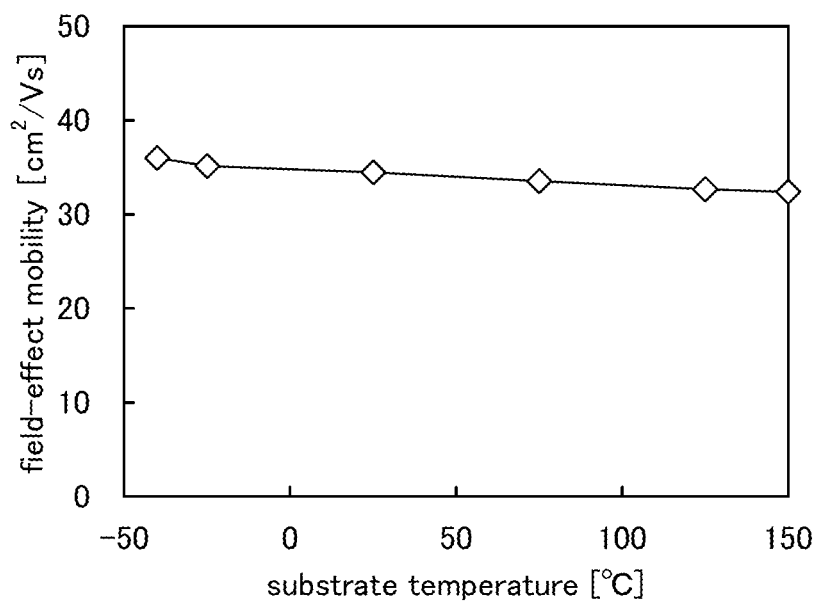

From FIG. 26B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

EXAMPLE 2

In this example, an example of a transistor in which an In—Sn—Zn—O film is used as an oxide semiconductor layer will be described below with reference to FIGS. 27A and 27B.

Figure 27A:
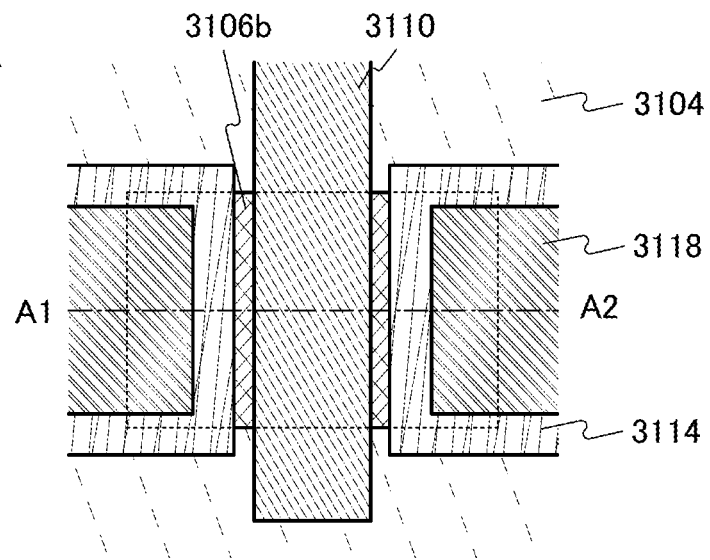
FIGS. 27A and 27B are a top view of a semiconductor device and a cross-sectional view thereof, respectively.
Figure 27B:
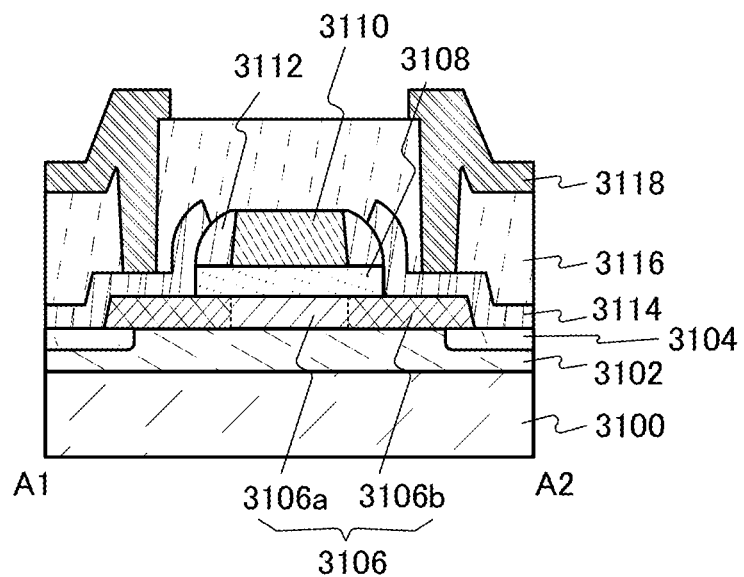

FIGS. 27A and 27B are a top view and a cross-sectional view of a coplanar transistor having a top-gate top-contact structure. FIG. 27A is the top view of the transistor. FIG. 27B illustrates a cross section A1-A2 along dashed-dotted line A1-A2 in FIG. 27A.

The transistor illustrated in FIG. 27B includes a substrate 3100; a base insulating layer 3102 provided over the substrate 3100; a protective insulating film 3104 provided in the periphery of the base insulating layer 3102; an oxide semiconductor layer 3106 provided over the base insulating layer 3102 and the protective insulating film 3104 and including a high-resistance region 3106a and low-resistance regions 3106b; a gate insulating layer 3108 provided over the oxide semiconductor layer 3106; a gate electrode 3110 provided to overlap with the oxide semiconductor layer 3106 with the gate insulating layer 3108 positioned therebetween; a sidewall insulating film 3112 provided in contact with a side surface of the gate electrode 3110; a pair of electrodes 3114 provided in contact with at least the low-resistance regions 3106b; an interlayer insulating film 3116 provided to cover at least the oxide semiconductor layer 3106, the gate electrode 3110, and the pair of electrodes 3114; and a wiring 3118 provided to be connected to at least one of the pair of electrodes 3114 through an opening formed in the interlayer insulating film 3116.

Although not illustrated, a protective film may be provided to cover the interlayer insulating film 3116 and the wiring 3118. With the protective film, a minute amount of leak current generated by surface conduction of the interlayer insulating film 3116 can be reduced and thus the off-state current of the transistor can be reduced.

EXAMPLE 3

In this example, another example of a transistor in which an In—Sn—Zn—O film is used as an oxide semiconductor layer will be described below.

Figure 28A:
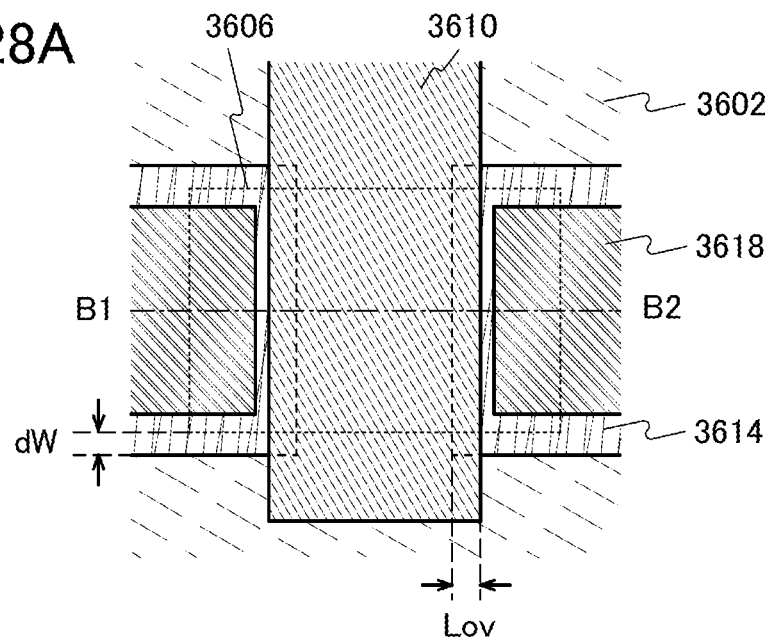
FIGS. 28A and 28B are a top view of a semiconductor device and a cross-sectional view thereof, respectively.
Figure 28B:
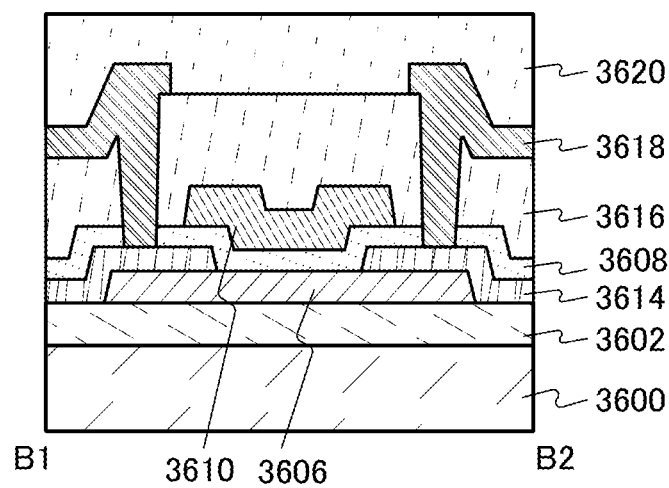

FIGS. 28A and 28B are a top view and a cross-sectional view, which illustrate a structure of a transistor manufactured in this example. FIG. 28A is the top view of the transistor. FIG. 28B is a cross-sectional view along dashed-dotted line B1-B2 in FIG. 28A.

The transistor illustrated in FIG. 28B includes a substrate 3600; a base insulating layer 3602 provided over the substrate 3600; an oxide semiconductor layer 3606 provided over the base insulating layer 3602; a pair of electrodes 3614 in contact with the oxide semiconductor layer 3606; a gate insulating layer 3608 provided over the oxide semiconductor layer 3606 and the pair of electrodes 3614; a gate electrode 3610 provided to overlap with the oxide semiconductor layer 3606 with the gate insulating layer 3608 positioned therebetween; an interlayer insulating film 3616 provided to cover the gate insulating layer 3608 and the gate electrode 3610; wirings 3618 connected to the pair of electrodes 3614 through openings formed in the interlayer insulating film 3616; and a protective film 3620 provided to cover the interlayer insulating film 3616 and the wirings 3618.

As the substrate 3600, a glass substrate can be used. As the base insulating layer 3602, a silicon oxide film can be used. As the oxide semiconductor layer 3606, an In—Sn—Zn—O film can be used. As the pair of electrodes 3614, a tungsten film can be used. As the gate insulating layer 3608, a silicon oxide film can be used. The gate electrode 3610 can have a stacked structure of a tantalum nitride film and a tungsten film. The interlayer insulating film 3616 can have a stacked structure of a silicon oxynitride film and a polyimide film. The wirings 3618 can each have a stacked structure in which a titanium film, an aluminum film, and a titanium film are formed in this order. As the protective film 3620, a polyimide film can be used.

Note that in the transistor having the structure illustrated in FIG. 28A, the width of a portion where the gate electrode 3610 overlaps with one of the pair of electrodes 3614 is referred to as Lov. Similarly, the width of a portion of the pair of electrodes 3614, which does not overlap with the oxide semiconductor layer 3606, is referred to as dW.

This application is based on Japanese Patent Application serial no. 2011-096607 filed with Japan Patent Office on Apr. 22, 2011 and Japanese Patent Application serial no. 2011-112691 filed with Japan Patent Office on May 19, 2011, the entire contents of which are hereby incorporated by reference.

What is claimed is:

1. A semiconductor device comprising:
    a first wiring;
    a second wiring;
    a third wiring;
    a first protection circuit comprising:
        a first nonlinear element; and
        a third nonlinear element over the first nonlinear element, the third nonlinear element being electrically connected to the first nonlinear element in series; and
    a second protection circuit comprising:
        a second nonlinear element; and
        a fourth nonlinear element over the second nonlinear element, the fourth nonlinear element being electrically connected to the second nonlinear element in series,
    wherein the first protection circuit is electrically connected between the first wiring and the second wiring so that a forward bias is applied to the first nonlinear element and the third nonlinear element included in the first protection circuit when a potential of the first wiring is higher than a potential of the second wiring,
    wherein the second protection circuit is electrically connected between the first wiring and the third wiring so that a forward bias is applied to the second nonlinear element and the fourth nonlinear element included in the second protection circuit when the potential of the first wiring is lower than a potential of the third wiring,
    wherein the first nonlinear element and the second nonlinear element include silicon,
    wherein the third nonlinear element and the fourth nonlinear element are transistors including an oxide semiconductor in their respective channel formation regions,
    wherein the first nonlinear element and the second nonlinear element are transistors including silicon in their respective channel formation regions, and
    wherein the transistors are p-channel transistors.

2. The semiconductor device according to claim 1,
    wherein the first wiring is a signal line through which a signal is input to a semiconductor circuit,
    wherein the second wiring is a first power supply line,
    wherein the third wiring is a second power supply line, and
    wherein a potential of the first power supply line is higher than a potential of the second power supply line.

3. The semiconductor device according to claim 1, wherein the transistors are diode-connected.

4. A semiconductor device comprising:
    a first wiring;
    a second wiring;
    a protection circuit comprising:
        a first transistor including silicon in a channel formation region; and
        a second transistor including an oxide semiconductor in a channel formation region, the second transistor being over the first transistor and electrically connected to the first transistor in series,
    wherein the protection circuit is electrically connected between the first wiring and the second wiring so that a forward bias is applied to the first transistor and the second transistor included in the protection circuit when a potential of the first wiring is higher than a potential of the second wiring,
    wherein the first transistor is a p-channel transistor, and
    wherein the second transistor is a n-channel transistor.

5. A semiconductor device comprising:
    a circuit;
    a first wiring;
    a second wiring;
    a protection circuit comprising:
        a first transistor comprising:
            a first channel formation region including silicon;
            a first gate electrode;
            a first source electrode; and
            a first drain electrode;
        a second transistor over the first transistor comprising:
            a second channel formation region including an oxide semiconductor;
            a second gate electrode;
            a second source electrode; and
            a second drain electrode,
    wherein the first wiring is electrically connected to the circuit,
    wherein one of the first source electrode and the first drain electrode is electrically connected to the first gate electrode and the second wiring,
    wherein one of the second source electrode and the second drain electrode is electrically connected to the second gate electrode and the first wiring,
    wherein the other of the first source electrode and the first drain electrode is electrically connected to the other of the second source electrode and the second drain electrode, and
    wherein the first transistor is a p-channel transistor.

* * * * *